(12) United States Patent
Takei

(10) Patent No.: US 8,264,036 B2
(45) Date of Patent: Sep. 11, 2012

(54) POWER SEMICONDUCTOR DEVICE WITH LOW ON-STATE VOLTAGE AND METHOD OF MANUFACTURING THE SAME

(75) Inventor: Manabu Takei, Shiojiri (JP)

(73) Assignee: Fuji Electric Co., Ltd. (JP)

( * ) Notice: Subject to any disclaimer, the term of this patent is extended or adjusted under 35 U.S.C. 154(b) by 201 days.

(21) Appl. No.: 12/617,077

(22) Filed: Nov. 12, 2009

(65) Prior Publication Data

US 2010/0140657 A1   Jun. 10, 2010

(30) Foreign Application Priority Data

Nov. 12, 2008   (JP) ................ 2008-289716

(51) Int. Cl.
*H01L 29/66* (2006.01)
*H01L 21/232* (2006.01)
(52) U.S. Cl. ........ 257/335; 257/526; 257/565; 438/138
(58) Field of Classification Search ............... 257/526, 257/335, 565, E21.385; 438/138
See application file for complete search history.

(56) References Cited

U.S. PATENT DOCUMENTS

| | | | |
|---|---|---|---|
| 5,714,775 A | 2/1998 | Inoue et al. | |
| 5,751,024 A | 5/1998 | Takahashi | |
| 6,919,599 B2* | 7/2005 | Henson | 257/331 |
| 7,262,478 B2* | 8/2007 | Takei | 257/526 |
| 2006/0049434 A1 | 3/2006 | Takei | |
| 2006/0049439 A1* | 3/2006 | Oh et al. | 257/292 |

FOREIGN PATENT DOCUMENTS

| | | |
|---|---|---|
| JP | 08-316479 A | 11/1996 |
| JP | 2000-091572 A | 3/2000 |
| JP | 2002-532885 A | 10/2002 |
| JP | 2003-078139 A | 3/2003 |
| JP | 2003-347549 A | 12/2003 |
| JP | 2006-237553 A | 9/2006 |
| WO | 0035021 A1 | 6/2000 |

OTHER PUBLICATIONS

I. Omura et al., "Carrier injection enhancement effect of high voltage MOS devices—Device physics and design concept." ISPSD '97, pp. 217-220.

* cited by examiner

*Primary Examiner* — Howard Weiss
*Assistant Examiner* — Steven Rao
(74) *Attorney, Agent, or Firm* — Rossi, Kimms & McDowell LLP

(57) ABSTRACT

A semiconductor device according to the invention includes n-type semiconductor substrate 1; trenches 15 formed in the surface portion of semiconductor substrate 1; a protruding semiconductor region between trenches 15; p-type base layer 2 in the protruding semiconductor region, p-type base layer 2 being positioned as deep as or shallower than trench 15; an $n^{++}$-type emitter region or a source region in the surface portion of p-type base layer 2; gate insulator film 4a on the first side wall of the protruding semiconductor region; and gate electrode 6 on gate insulator film 4a. Trench 15 is from 0.5 μm to 3.0 μm deep and the short side of trench 15 is 1.0 μm or longer. The short side of the protruding semiconductor region is from 0.5 μm to 3.0 μm long. Gate electrode 6 contains electrically conductive polycrystalline silicon as its main component. Gate electrode 6 is from 0.2 μm to 1.0 μm thick. The semiconductor device according to the invention is manufactured with very low manufacturing costs and with a high throughput of non-defective products. The semiconductor device according to the invention facilitates exhibiting a high IE effects, exhibiting a low ON-state voltage, preventing electric field localization from causing and realizing a high breakdown voltage.

17 Claims, 25 Drawing Sheets

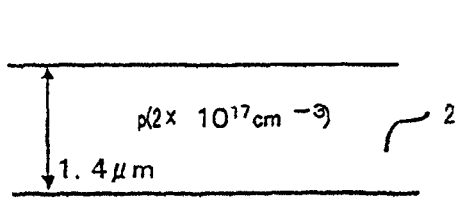
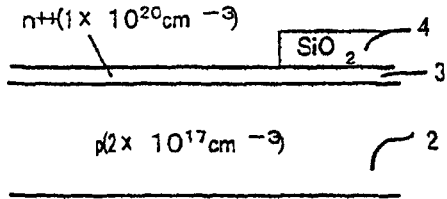
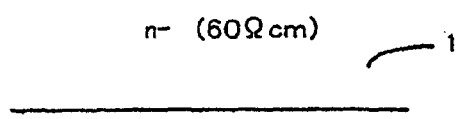
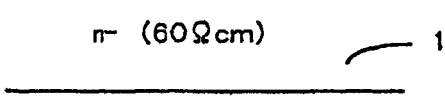
FIG. 1A  FIG. 1B
FIG. 1C  FIG. 1D
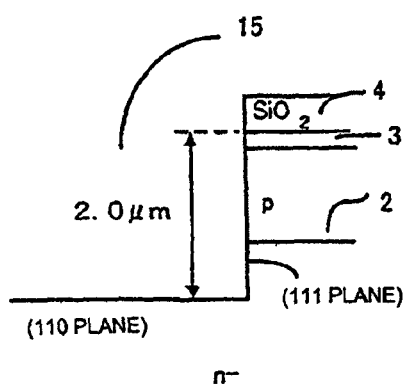
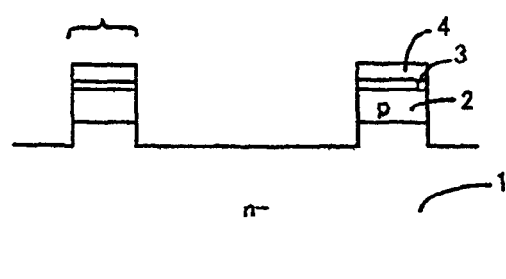
FIG. 1E
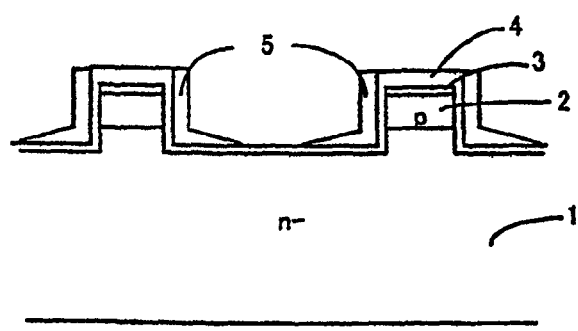

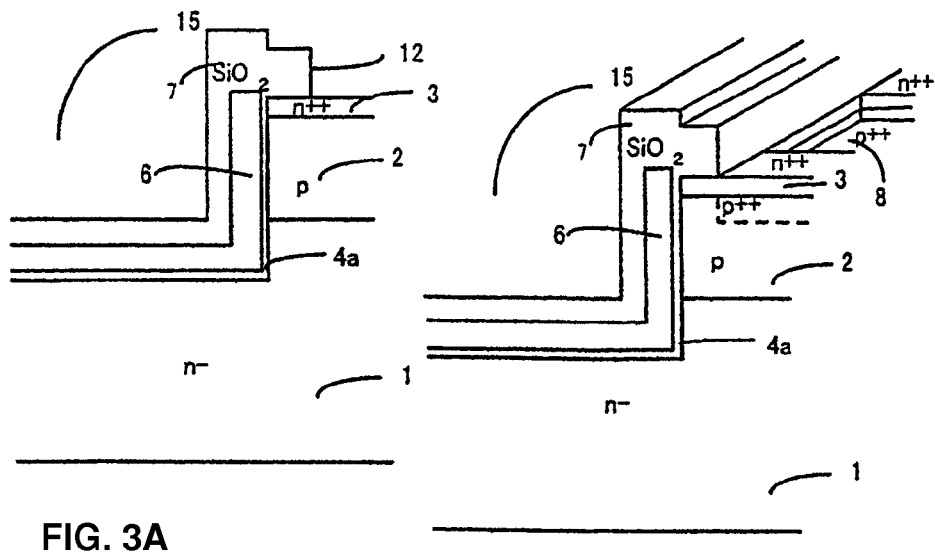
FIG. 3A
FIG. 3B
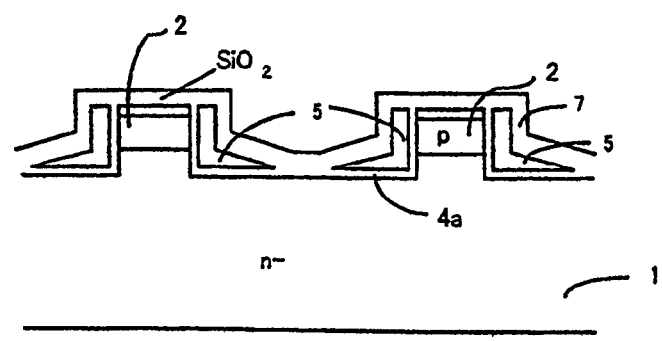
FIG. 3C
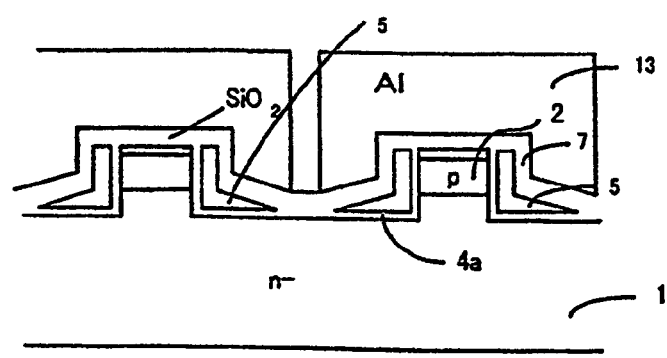
FIG. 3D

FIG. 5A
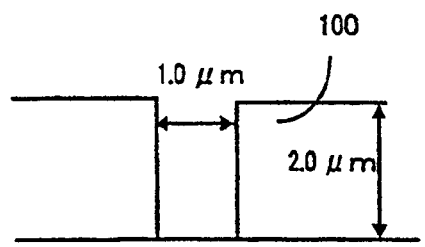
FIG. 5B
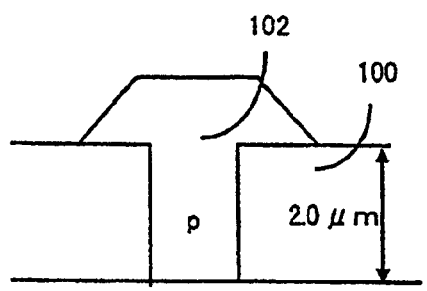
FIG. 5C
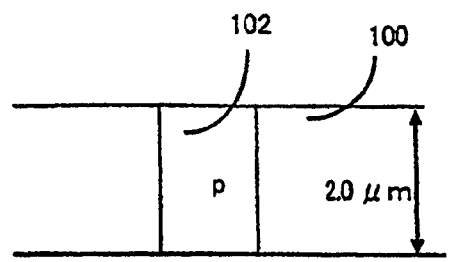
FIG. 5D
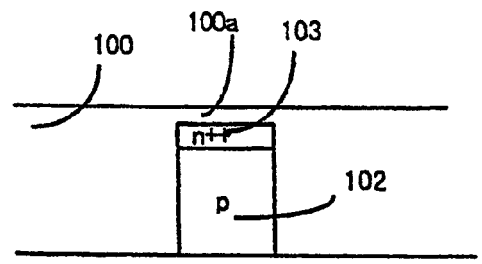
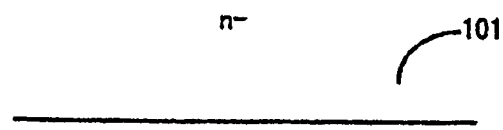

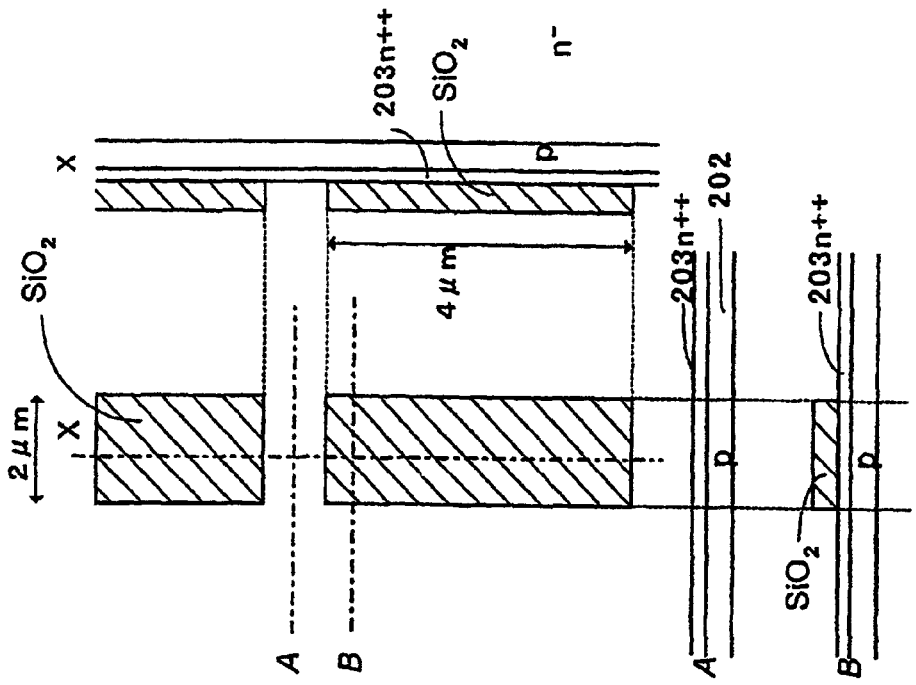
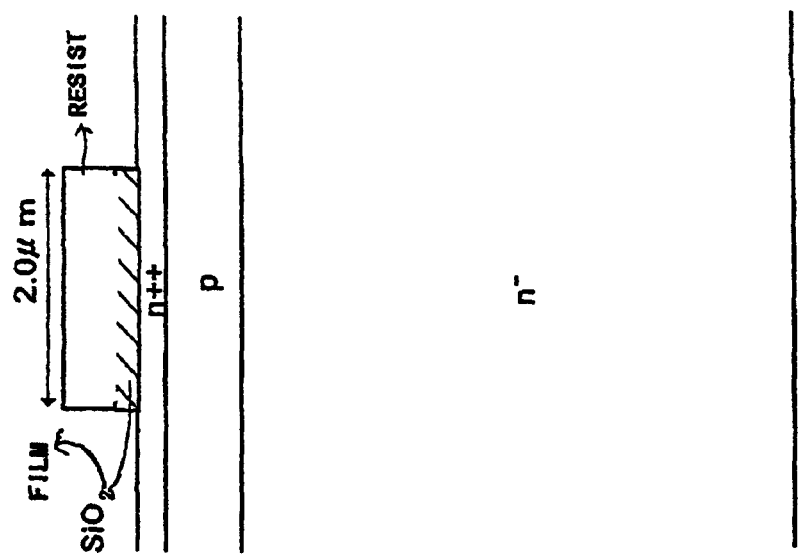

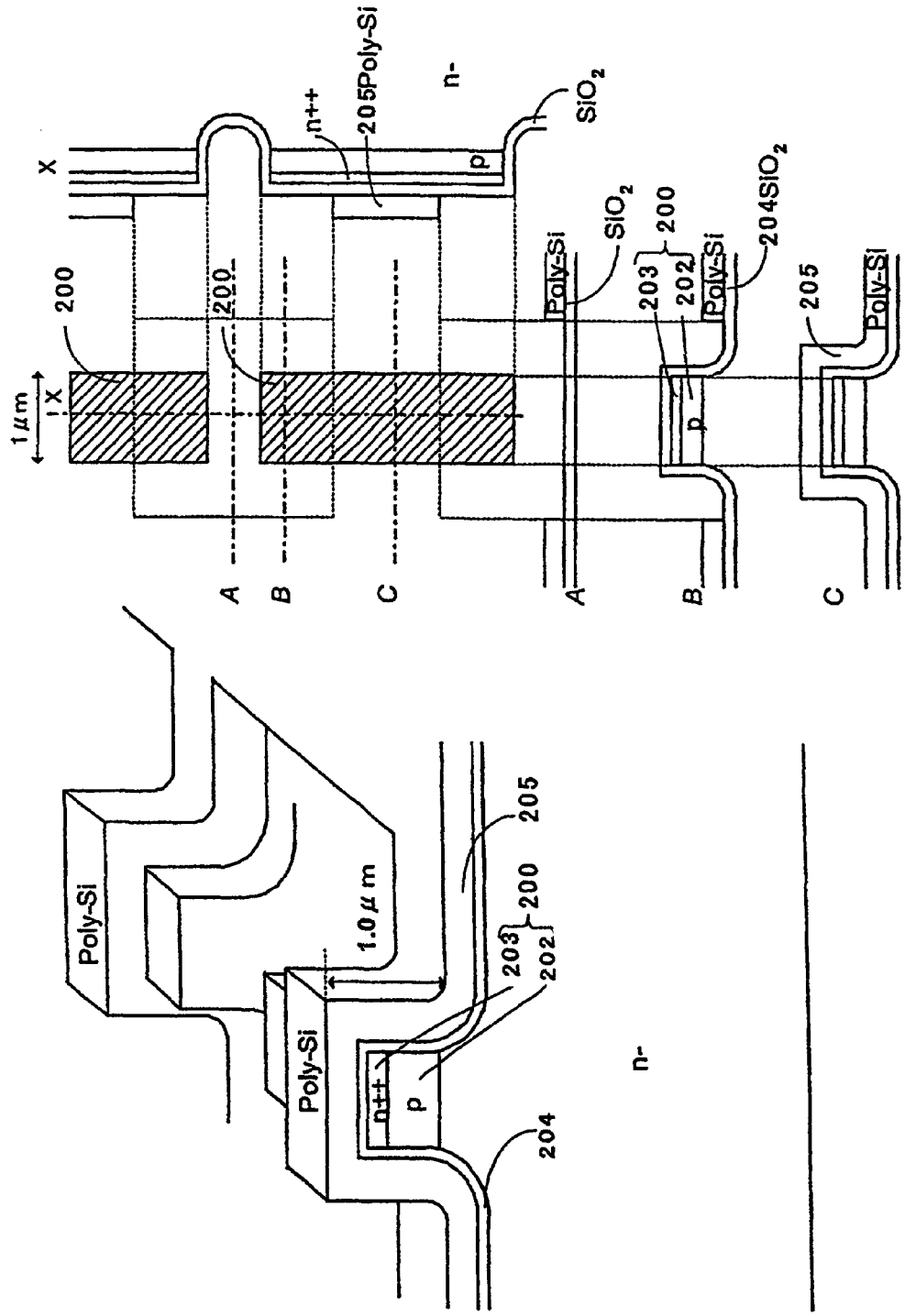

POWER SEMICONDUCTOR DEVICE WITH LOW ON-STATE VOLTAGE AND METHOD OF MANUFACTURING THE SAME

BACKGROUND OF THE INVENTION

A. Field of the Invention

The present invention relates to a power semiconductor device used in electric power converters. Specifically, the invention relates to an IGBT and such a MOS semiconductor device and the method of manufacturing the MOS semiconductor device.

B. Description of the Related Art

The performance of the IGBT has progressed through many improvements. It has been required for the IGBT in the OFF-state to sustain the voltage of the current to be controlled and to interrupt the current to be controlled perfectly. It has been required for the IGBT in the ON-state to make the current to be controlled flow with a voltage drop as low as possible, i.e., with small ON-state resistance, and to work as a switch that causes a low power loss.

There exists a tradeoff relation between the maximum voltage that the IGBT can sustain, i.e., the breakdown voltage, and the voltage drop caused in the ON-state of the IGBT. In the IGBT exhibiting a higher breakdown voltage, a higher ON-state voltage results. To improve the characteristics in the tradeoff relation to the achievable limit, it is necessary to explore many developments for designing the device structure. These include exploring a structure for preventing electric field localization from resulting in sustaining the applied voltage of the current to be controlled.

Another important index that indicates the performances of the IGBT is the tradeoff relation between the ON-state voltage and the switching losses, especially the turnoff loss. Since the turnoff proceeds more slowly as the ON-state voltage is lower, a larger turnoff loss is caused. If the turnoff loss is decreased, a higher ON-state voltage results. If the tradeoff relation is improved, the performances of the IGBT will be improved.

In order to bring the characteristics in the tradeoff relations described above into the best mutual relationship, it is effective to reduce the carrier concentration on the anode side and to raise the carrier concentration on the cathode side so that the ratio of the carrier concentration on the anode side and the carrier concentration on the cathode side is about 1:5. Moreover, it is effective to elongate the carrier lifetime in an $n^-$-type drift layer as long as possible so that the average carrier concentration in the $n^-$-type drift layer is high. The mechanism for raising the carrier concentration on the cathode side is called the "electron injection enhancement effect" (hereinafter referred to as the "IE effect").

For the cathode structure exhibiting a high IE effect, a high-conductivity IGBT structure (hereinafter referred to as a "HiGT structure") has been proposed (cf. Japanese Unexamined Patent Application Publication No. 2003-347549 and Japanese Unexamined Patent Application Publication (Translation of PCT Application) No. 2002-532885. The HiGT structure is formed of a heavily doped $n^+$-type layer inserted in such an arrangement that the heavily doped $n^+$-type layer surrounds a p-type base in a planar-gate structure. Moreover, a carrier-stored trench-gate bipolar transistor structure (hereinafter referred to as a "CSTBT structure") and an injection enhancement gate transistor structure (hereinafter referred to as an "IEGT structure") have been proposed for obtaining a high IE effect in the trench-gate structure (cf. Japanese Unexamined Patent Application Publication No. Hei. 8 (1996)-316479 and Omura et. al., "Carrier injection enhancement effect of high voltage MOS devices—Device physics and design concept", ISPSD '97, pp. 217-220. In the CSTBT structure and IEGT structure, an n-type layer doped more heavily than the $n^-$-type drift layer is inserted into the mesa section between the adjacent trenches. Generally, the IE effect in the trench-gate structure is larger than the IE effect in the planar-gate structure.

To realize an optimum carrier distribution localized on the cathode side, it is effective to narrow the pnp-BJT region and to widen the pin-diode region. In the structures exhibiting an IE effect and proposed so far, the ratio of the pin-diode region is increased and the forward bias in an $n^+/n^-$-junction plane also is increased.

The IE effect is enhanced also in the IGBT having a trench-gate structure by reducing the ratio of the pnp-BJT region. To reduce the ratio of the pnp-BJT region, it is effective to bring p-type base layers in some mesa sections into an electrically floating state. The IE effect is also enhanced by deepening the trench to separate the trench bottom from the pn-junction. The IE effect is enhanced also by narrowing the mesa section. It is considered that these structures increase the density of the hole current flowing through the mesa section and intensifies the forward bias caused in the $n^+/n^-$-junction plane by the voltage drop.

In the CSTBT structure and IEGT structure that utilize the trench-gate structure and include an $n^+$-type layer doped more heavily than the $n^-$-type layer and inserted into a mesa region between adjacent trenches, a carrier distribution localized on the emitter side is obtained and the characteristics are fairly improved. However, there is room for further improvement. To lower the ON-state voltage, it is effective to further raise the carrier concentration on the emitter side. In other words, the IE effect (injection enhancement effect) obtained in the IGBT so far is insufficient.

The manufacturing process for manufacturing the conventional trench-gate structure is longer and more complicated than the manufacturing process for manufacturing the planar-gate structure. The throughput for manufacturing the non-defective trench-gate structure is lower than the throughput for manufacturing the non-defective planar-gate structure. The manufacturing costs for the conventional trench-gate structure tend to be higher than the manufacturing costs for the planar-gate structure. In order to make the cell structure more minute and meticulous to further improve the device characteristics, the manufacturing costs will soar even higher. In the IGBT having the conventional trench-gate structure, the electric field is liable to localize to the trench bottom and avalanche breakdown is caused easily. Therefore, the breakdown voltage of the IGBT having the conventional trench-gate structure generally is liable to decrease.

In view of the foregoing, it would be desirable to obviate the problems described above. It would also be desirable to provide a semiconductor device that exhibits a high IE effect, exhibits a low ON-state voltage, facilitates preventing electric field localization from causing, and exhibits a high breakdown voltage. It would also be desirable to provide a method for manufacturing the semiconductor device having the favorable features as described above through an inexpensive manufacturing process with a high throughput of non-defective products. The present invention is directed to overcoming or at least reducing the effects of one or more of the problems set forth above.

SUMMARY OF THE INVENTION

According to the invention, there is provided a semiconductor device including a semiconductor substrate of a first conductivity type having a first major surface; a trench formed from the first major surface; a protruding semiconductor region between the trenches extending in parallel to each other, the protruding semiconductor region being narrower than the trench; a base layer of a second conductivity type in the protruding semiconductor region; a region of the first conductivity type on the surface side of the base layer; a gate insulator film on the first side wall of the protruding semiconductor region; a gate electrode on the gate insulator film; the protruding semiconductor region being from 0.5 µm to 3.0 µm in short side width; the trench being from 0.5 µm to 3.0 µm in depth; the trench being 1.0 µm or longer in short side width; the trench being wider than the protruding semiconductor region in the short side widths thereof; the gate electrode containing electrically conductive polycrystalline silicon as a main component thereof; and the gate electrode being from 0.2 µm to 1.0 µm in thickness.

In one embodiment, the base layer is an epitaxial semiconductor layer. The base layer may be formed by ion implantation. The layer formed by implantation may be formed of a layer formed by twice or more times of ion implantation, with the ion implantation depths thereof being different from each other.

The protruding semiconductor region may be divided into a plurality of protruding semiconductor island regions aligned with predetermined intervals in the extending direction thereof; the gate electrode on the gate insulator film on the first side wall along the extending direction of the protruding semiconductor island region may cross over the gate insulator film in perpendicular to the extending direction of the protruding semiconductor island region in a central portion thereof such that the gate electrode is connected to a gate electrode on the other side of the protruding semiconductor island region; and the semiconductor device may further include a metal electrode in electrical contact with the base layer of the second conductivity type and the region of the first conductivity type exposed to the second side wall of the protruding semiconductor island region, the second side wall intersecting the extending direction of the protruding semiconductor island region.

A method of manufacturing the semiconductor device described above may include the step of forming the trenches, extending in parallel to each other and extending from the surface of the base layer formed on the first major surface side of semiconductor substrate to the semiconductor substrate, for forming the protruding semiconductor region between the trenches. The method may further include the steps of depositing electrically conductive polycrystalline silicon on the protruding semiconductor region; and removing the polycrystalline silicon on the protruding semiconductor region from the surface thereof by dry-etching or by wet-etching for forming the gate electrode.

The method of manufacturing the semiconductor device may include the steps of forming an oxide film on the first major surface of the semiconductor substrate by thermal oxidation or by CVD; patterning the oxide film; selectively growing the epitaxial semiconductor layer on an exposed surface of the semiconductor substrate using the oxide film for a mask; and removing the oxide film for forming the protruding semiconductor region.

The step of selectively growing the epitaxial semiconductor layer using the oxide film for a mask for forming the protruding semiconductor region may include feeding an etching gas simultaneously with feeding a semiconductor gas for forming the epitaxial semiconductor layer. The method may further include the step of polishing the surface of the epitaxial semiconductor layer to remove an excessive semiconductor layer grown on the oxide film and to flatten the epitaxial semiconductor layer, the step of polishing being conducted after selectively growing the epitaxial semiconductor layer using the oxide film for a mask.

The method of manufacturing the semiconductor device may include the step of forming the protruding semiconductor region in the voltage blocking structure region simultaneously with forming the protruding semiconductor region in the active region, the protruding semiconductor region in the voltage blocking structure region working for a guard ring. The method may further include the step of polishing to remove polycrystalline silicon deposited on the protruding semiconductor region and working for a guard ring in the voltage blocking structure region and to remove a part of the polycrystalline silicon deposited between the adjacent guard rings utilizing the dishing phenomena.

The semiconductor device according to the invention is manufactured with very low manufacturing costs and with a high throughput of non-defective products. The semiconductor device according to the invention facilitates exhibiting high IE effects, exhibiting a low ON-state voltage, preventing electric field localization from causing and obtaining a high breakdown voltage.

BRIEF DESCRIPTION OF THE DRAWINGS

The foregoing advantages and features of the invention will become apparent upon reference to the following detailed description and the accompanying drawings, of which:

FIGS. 1A, 1B, 1C, 1D, and 1E are cross sectional views of a semiconductor wafer describing the main manufacturing steps for manufacturing a non-punch-through IGBT exhibiting a rated breakdown voltage of 1200 V (hereinafter referred to as a "1200V-NPT-IGBT") according to a first embodiment of the invention.

FIGS. 3A, 3C, and 3D are cross sectional views of the semiconductor wafer describing the main manufacturing steps for manufacturing the 1200V-NPT-IGBT according to the first embodiment.

FIG. 3B is a plan view of the semiconductor wafer describing the main manufacturing step for manufacturing the 1200V-NPT-IGBT according to the first embodiment.

FIGS. 5A, 5B, 5C, and 5D are cross sectional views of a semiconductor wafer describing the main manufacturing steps for manufacturing a non-punch-through IGBT exhibiting a rated breakdown voltage of 600 V (hereinafter referred to as a "600V-NPT-IGBT") according to a second embodiment of the invention.

FIG. 16A is a cross sectional view of the semiconductor wafer describing the main manufacturing step for manufacturing the 1200V-FS-IGBT according to the third embodiment.

FIG. 16B is an explanatory drawing including a top plan view and three cross sectional views of the semiconductor wafer for describing the main manufacturing step for manufacturing the 1200V-FS-IGBT according to the third embodiment.

FIG. 19A is a plan view of the semiconductor wafer describing the main manufacturing step for manufacturing the 1200V-FS-IGBT according to the third embodiment.

FIG. 19B is an explanatory drawing including a top plan view and four cross sectional views of the semiconductor wafer for describing the main manufacturing step for manufacturing the 1200V-FS-IGBT according to the third embodiment.

DETAILED DESCRIPTION OF SPECIFIC EMBODIMENTS

Figure 2A:
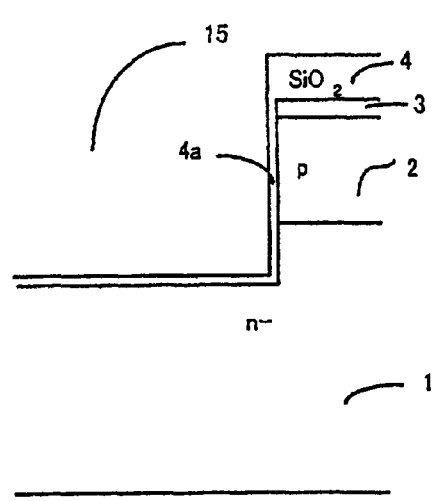
FIGS. 2A, 2B, 2C, and 2D are cross sectional views of the semiconductor wafer describing the main manufacturing steps for manufacturing the 1200V-NPT-IGBT according to the first embodiment.

Now the invention will be described in detail hereinafter with reference to the accompanied drawings which illustrate the preferred embodiments of the invention. Although the invention will be described below in connection with the preferred embodiments thereof, changes and modifications will be obvious to the persons skilled in the art without departing from the true spirit of the invention. Therefore, the invention should be limited not by the specific descriptions herein but by the appended claims.

First Embodiment

FIGS. 1A, 1B, 1C, 1D, 1E, 2A, 2B, 2C, 2D, 3A, 3C, 3D, and 4 are cross sectional views of a semiconductor wafer describing the main manufacturing steps for manufacturing a non-punch-through IGBT exhibiting a rated breakdown voltage of 1200 V (hereinafter referred to as a "1200V-NPT-IGBT") according to a first embodiment of the invention. FIG. 3B is a plan view of the semiconductor wafer describing the main manufacturing step for manufacturing the 1200V-NPT-IGBT according to the first embodiment.

Now the manufacturing steps for manufacturing the 1200V-NPT-IGBT according to the first embodiment will be described below with reference to these drawings. Referring first to FIG. 1A, n-type FZ silicon substrate 1, having a (100) major surface and exhibiting the resistivity of 60 Ωcm, is prepared as the starting material. The n-type FZ silicon substrate 1 will serve as n$^-$-type drift layer 1. At first, trichlorosilane, diborane, and hydrogen are fed to an epitaxial growth furnace. A p-type epitaxial layer 2, having a boron concentration of $2\times10^{17}$ cm$^{-3}$ and a thickness of 1.4 μm, is grown at 1000° C. on silicon substrate 1. Hereinafter, the entire silicon substrate provided with the working treatment will be referred to as the "wafer."

Referring now to FIG. 1B, a screen oxide film (not-shown) is grown for the thickness of 500 Å on p-type epitaxial layer 2 and n$^{++}$-type emitter region 3 is formed by implanting arsenic ions at the dose amount of $5\times10^{15}$ cm$^{-2}$ (the impurity concentration: $1\times10^{20}$ cm$^{-3}$) and under the acceleration energy of 150 keV. Then, oxide film 4 is formed by thermal oxidation for the thickness of 4000 Å on n$^{++}$-type emitter region 3. Then, oxide film 4 is removed through a photoetching step leaving a portion with a width of about 3 μm, of oxide film 4, which is a protruding semiconductor region described later.

Referring now to FIG. 1C, trench 15 of 2 μm in depth is formed vertically from the surface of p-type epitaxial layer 2 by dry-etching using the remaining oxide film 4 for a mask. The side wall of trench 15 after the trench etching is made to coincide with the (111) plane with reference to the (110)

wafer major surface. Hereinafter, the vertical side wall will be referred to as the "first side wall of the protruding semiconductor region." In the etched region, the p-type epitaxial layer of 1.4 µm in thickness is removed completely from the etched region by trench 15 of 2 µm in depth and the (110) plane of n⁻-type drift layer 1 is exposed.

It is preferable to set the depth of trench 15 in the range between 0.5 µm and 3.0 µm. When trench 15 is shallower than about 0.5 µm, the breakdown voltage is limited by the punch-through voltage of p-type base layer 2 in the voltage blocking at the ordinary impurity concentration of p-type base layer 2 and the breakdown voltage is lowered. When trench 15 is deeper than about 3.0 µm, a trench step that is too high is caused that does not fill trench 15 with polysilicon, and the accuracy of the photoprocess is impaired.

According to the invention, it is preferable for the final trench step to be 2 µm or lower. Therefore, when the trench is 3 µm deep, the thickness of the polysilicon gate electrode is set at 1 µm, which is the maximum preferable thickness thereof. When the trench is shallower than 3 µm, the polysilicon gate electrode may be thinner than 1 µm with no problem such that trench step will be 2 µm or lower.

Moreover, it is preferable to set the short side width of trench 15 to be equal to or longer than 1.0 µm. When the short side width of trench 15 is shorter than 1.0 µm, the width and the area of the protruding semiconductor region between trenches 15 are relatively large, impairing the IE (electron injection enhancement) effect.

It is preferable for the protruding semiconductor region to be from 0.5 µm to 3.0 µm in width. When the protruding semiconductor region is less than 0.5 µm in width, it is difficult to form a MOS region including effective p-type base layer 2 and effective n⁺⁺-type region 3. When the protruding semiconductor region is more than 3.0 µm in width, the width and the area of the protruding semiconductor region between trenches 15 are relatively large, impairing the IE (electron injection enhancement) effect.

In the voltage blocking structure region in the chip edge area, it is preferable to leave a part of p-type epitaxial layer 2 in the trench etching to make the part of p-type epitaxial layer 2 which remains serve as a guard ring structure as shown in FIG. 1D. Trench 15 is formed by dry-etching as described above. Alternatively, trench 15 may be formed by etching a wafer including p-type epitaxial layer 2 and having an (110) major surface with an aqueous solution containing 10 wt. % of tetramethyl ammonium hydroxide (hereinafter referred to as "TMAH") at 80° C. In the wet-etching, the selective etching ratio of the oxide film and silicon is more than 500. Therefore, silicon is etched selectively by the wet-etching.

Figure 2B:
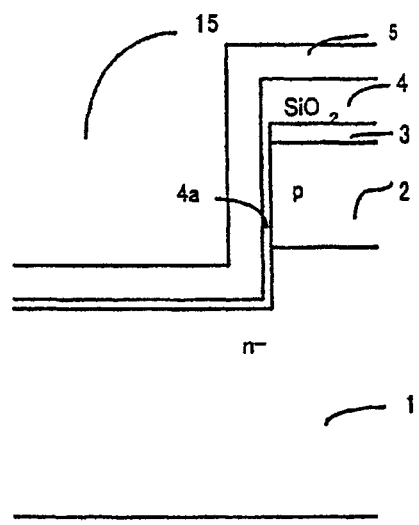

As shown in FIG. 2A, gate oxide film 4a of 800 Å in thickness is formed on the first side wall of the protruding semiconductor region in an oxidation furnace. In the region of oxide film 4, the total oxide film thickness increases by the thickness of gate oxide film 4a. Referring now to FIG. 2B, polysilicon layer 5 is deposited to a thickness of 0.8 µm on the wafer surface. Polysilicon layer 5 deposited is treated thermally at 900° C. in a POCl₃ atmosphere to heavily dope polysilicon layer 5 to be of an n-type.

Figure 2C:
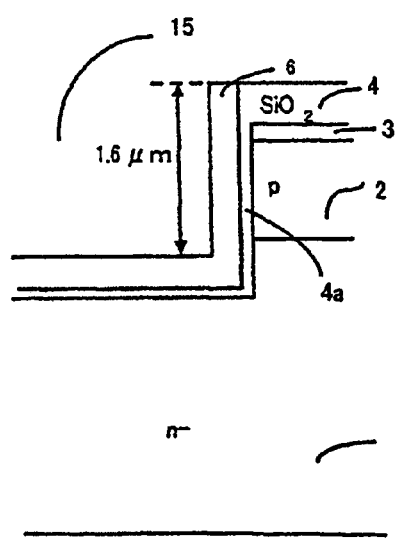

Referring now to FIG. 2C, the surface of polysilicon layer 5 is polished through a chemical mechanical polishing process (hereinafter referred to as a "CMP process"). A polishing exhibiting a selective polishing ratio of the oxide film and silicon of around 100 is used. The polishing is stopped leaving oxide film 4 on the protruding semiconductor region. By the polishing, polysilicon gate electrode 6 is formed by self alignment in relation to the shape of the protruding semiconductor region. The surface step height (the trench step of 2 µm and the oxide film thickness of 0.4 µm) caused by the trench etching described above is reduced by the thickness of polysilicon layer 6 (0.8 µm) to be 1.6 µm.

In the voltage blocking structure region in the chip edge area including a plurality of guard rings as shown in FIG. 1E, the spacing (the concave portion) between the guard rings is wider than the width of polysilicon layers 5 on p-type epitaxial layer 2 and serves as the guard rings. Therefore, when oxide film 4 on the protruding semiconductor region is polished, polysilicon layer 5 in the concave portion between the guard rings is shaped with a concave dish disconnected in the center thereof due to the dishing effect caused by the polishing.

Figure 2D:
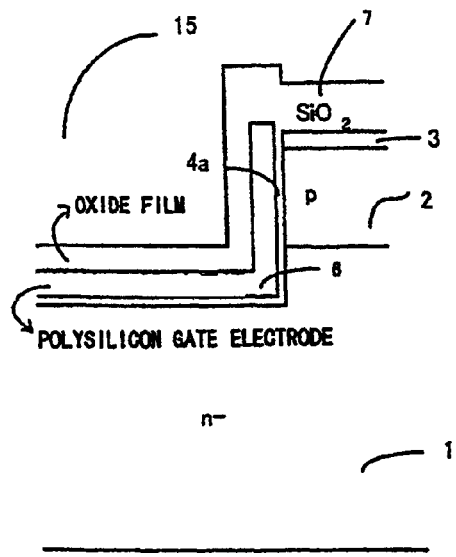

Referring now to FIG. 2D, polysilicon gate electrode 6 is thermally treated in an oxygen atmosphere to oxidize polysilicon gate electrode 6 and to form an oxide film, 0.6 µm thick. As a result, polysilicon gate electrode 6 is from 0.6 µm to 0.8 µm in thickness. The oxide film grown on polysilicon gate electrode 6 and oxide film 4 serving as a CMP stopper will serve as interlayer insulator film 7 between gate electrode 6 and emitter electrode 9. As shown in FIG. 3C, polysilicon layer 5 remaining between p-type epitaxial layers 2 serves as the guard rings in the voltage blocking structure region in the chip edge area functioning as a field plate.

Referring now to FIG. 3A a window is opened through interlayer insulator film 7 on the protruding semiconductor region by photoetching to expose the surface of n⁺⁺-type emitter region 3 for the width of 2 µm and to form contact line hole 12. Referring now to FIG. 3B, the surface of n⁺⁺-type emitter region 3 is etched selectively using the photoresist and interlayer insulator film 7 patterned as a mask to a depth of 0.5 µm to expose the surface of p-type base layer (p-type epitaxial layer) 2 periodically in the longitudinal direction of the surface pattern of stripe-shaped contact line hole 12. After removing the photoresist, second p⁺-type layer 8 is formed by implanting boron ions from the surface of p-type base layer (p-type epitaxial layer) 2 at the dose amount of $3 \times 10^{15}$ cm⁻² and under the acceleration energy of 150 keV. After removing the photoresist, the wafer is annealed in a nitrogen atmosphere at 1000° C. for 30 minutes to activate the implanted impurity (boron atoms). Second p⁺-type layer 8 is effective for reducing the contact resistance between emitter electrode 9 and p-type base layer 2 described later, for improving the latch-up withstand or resistance, and for preventing punch-through from happening through p-type base layer 2 in the voltage blocking.

Figure 4:
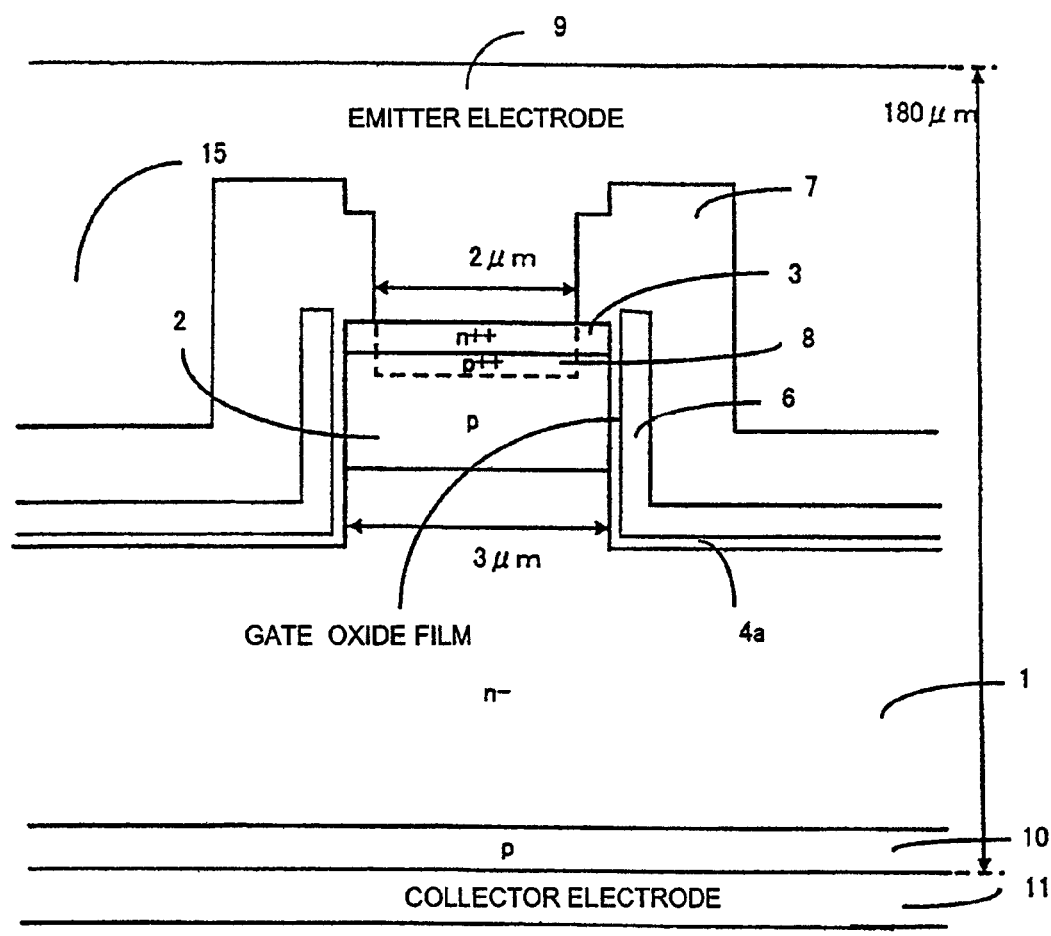
FIG. 4 is a cross sectional view of the semiconductor wafer of the 1200V-NPT-IGBT according to the first embodiment.

Referring now to FIG. 4, aluminum is sputtered to a thickness of 5 µm to form a metal film, and emitter electrode 9 is formed by photoetching. The wafer back surface is polished to set the wafer thickness at 200 µm. To remove the damage caused on the back surface side of the wafer, the silicon surface layer on the back surface side of the wafer is etched with a mixed acid to remove the damaged layer. The wet-etching reduces the wafer thickness to 180 µm. Boron ions are implanted from the back surface of the wafer at the dose amount of $1 \times 10^{14}$ cm⁻². Then, the wafer is annealed at 380° C. for 1 hour to form p-type collector layer 10.

Finally, a surface protector film (not shown) is formed by polyimide coating and photoetching. An aluminum film is deposited by vacuum deposition on the wafer back surface to form collector electrode 11. If necessary, a titanium film, a nickel film and a gold film additionally are deposited by vacuum deposition to form collector electrode 11. By dicing the wafer, a semiconductor chip is completed. In FIG. 3D that shows the cross section of the voltage blocking structure region, an aluminum film is coated over p-type epitaxial layer 2 and polysilicon layer 5 serving as a guard ring so that the aluminum film may function as field plate 13.

As described above, the manufacturing process is completed by conducting a total of five photoetching steps.

Figure 10:
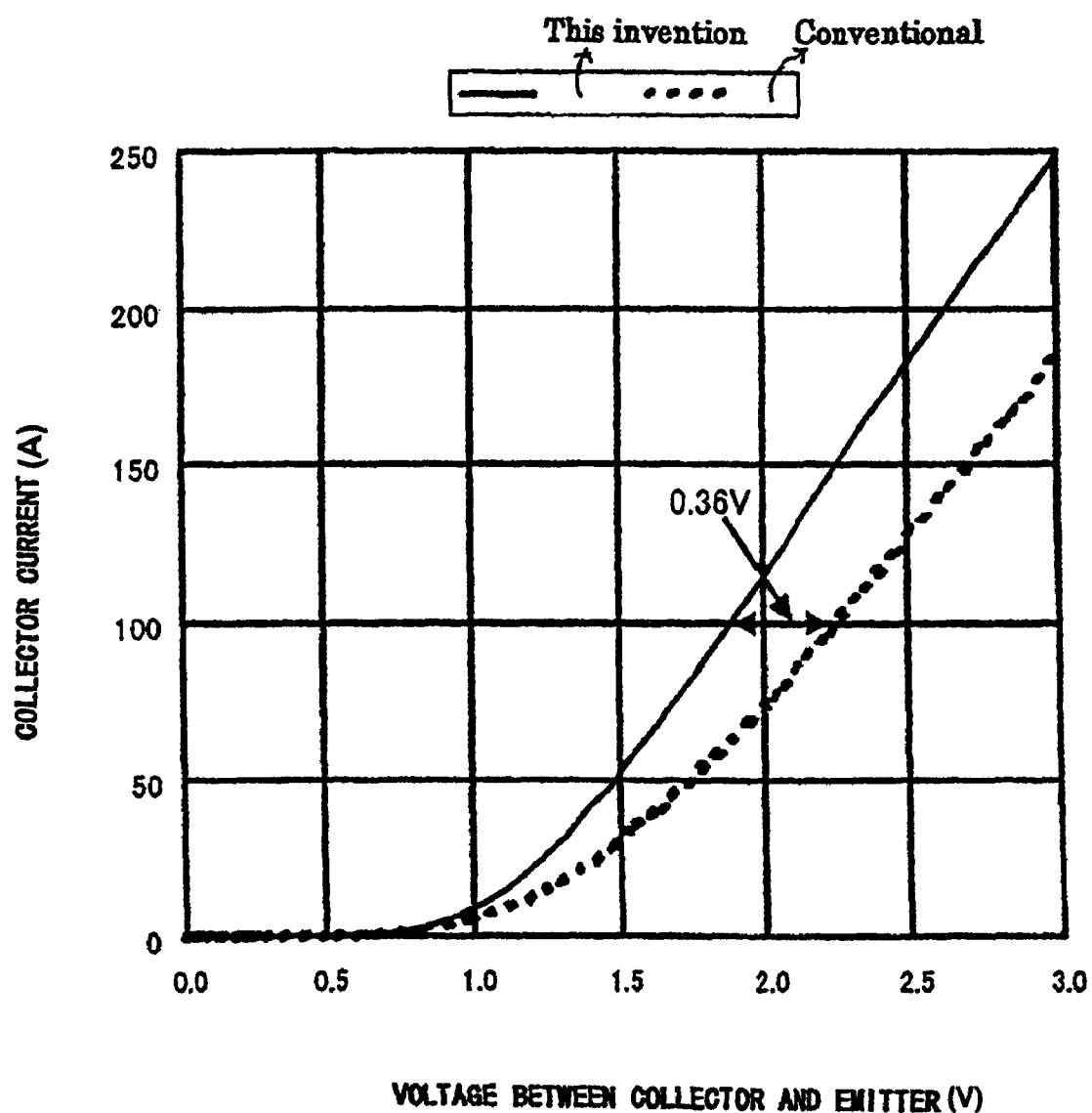
FIG. 10 shows a couple of curves comparing the output characteristics of a 1200V-NPT-IGBT according to the invention and a conventional 1200V-NPT-IGBT.

FIG. 10 shows a couple of curves for comparing the output characteristics of a 1200V-NPT-IGBT according to the invention (solid line) and a conventional 1200V-NPT-IGBT (broken line).

The IGBT according to the invention has a structure that facilitates localizing more carriers near the emitter side surface in the chip as compared with the conventional IGBT. Therefore, the ON-state voltage of the IGBT according to the invention is reduced as compared with the ON-state voltage of the conventional IGBT. The double-headed arrow in FIG. 10 indicates that the IGBT according to the invention reduces the ON-state voltage by 0.36 V at the current density of 100 A/cm$^2$. The cell pitch of the cell structure is 50 μm for the IGBT according to the invention and the conventional IGBT. The breakdown voltage is 1364 V for the conventional IGBT and 1455 V for the IGBT according to the invention. It is considered that a higher breakdown voltage is obtained by the IGBT according to the invention due to the structure thereof that hardly causes electric field localization.

Second Embodiment

FIGS. 5A, 5B, 5C, 5D, 6A, 6B, 6C, 7A, 7B, 9A and 9B are cross sectional views of a semiconductor wafer describing the main manufacturing steps for manufacturing a NPT-IGBT, the rated breakdown voltage thereof is 600V, (hereinafter referred to as a "600V-NPT-IGBT") according to a second embodiment of the invention. FIGS. 6D, 8A and 8B are plan views of the semiconductor wafer describing the main manufacturing steps for manufacturing the 600V-NPT-IGBT according to the second embodiment.

Now the manufacturing steps for manufacturing the 600V-NPT-IGBT according to the second embodiment will be described below with reference to these drawings.

Referring at first to FIG. 5A, n-type FZ silicon substrate 101, having a (100) major surface and exhibiting the resistivity of 30 Ωcm, is prepared as a starting material. Thermal oxide film 100, 2.0 μm thick, is grown by pyrogenic oxidation at 1150° C. for 13 hours. Alternatively, an oxide film, 2.0 μm thick, may be grown by chemical vapor deposition (hereinafter referred to as "CVD") with no problem. A part of thermal oxide film 100 is opened for 1.0 μm in width by pattering and dry-etching.

Referring now to FIG. 5B, trichlorosilane, diborane, hydrogen chloride, and hydrogen are fed to an epitaxial growth furnace to grow p-type epitaxial layer 102, the boron concentration thereof is 2×10$^{17}$ cm$^{-3}$, at 1000° C. for the thickness of 2.5 μm. By feeding hydrogen chloride simultaneously, high selectivity is obtained such that p-type epitaxial layer 102 grows on oxide film 100 only in the vicinity of the opening.

Referring now to FIG. 5C, the excessive silicon layer in the vicinity of the opening on oxide film 100 is removed by the CMP. A polishing slurry, exhibiting a high selective polishing ratio of the oxide film and silicon, is used and the polishing is stopped on the surface level of oxide film 100.

Referring now to FIG. 5D, screen oxide film 100a is grown for the thickness of 500 Å on p-type epitaxial layer 102 and n$^{++}$-type emitter region 103 is formed by implanting arsenic ions at the dose amount of 5×10$^{15}$ cm$^{-2}$ and under the acceleration energy of 150 keV.

Figure 6A:
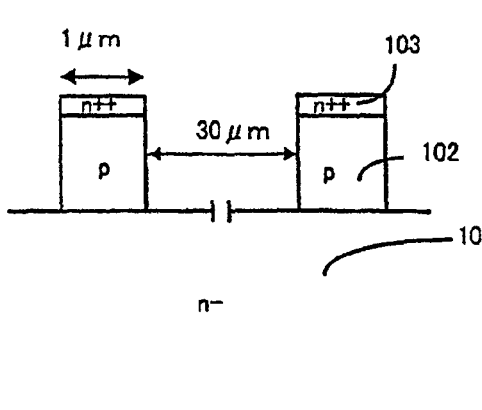
FIGS. 6A, 6B, and 6C are cross sectional views of the semiconductor wafer describing the main manufacturing steps for manufacturing the 600V-NPT-IGBT according to the second embodiment.

Referring now to FIG. 6A, wet-etching is conducted after patterning to remove oxide film 100 so that p-type epitaxial layers 102 that will serve as protruding semiconductor regions may be aligned with trench 115, 30 μm wide, interposed between the adjacent p-type epitaxial layers 102. Oxide film 100 remaining (not shown) will serve as a polishing stopper in polishing polysilicon layer 105 described later for forming polysilicon gate electrode 106.

Figure 6B:
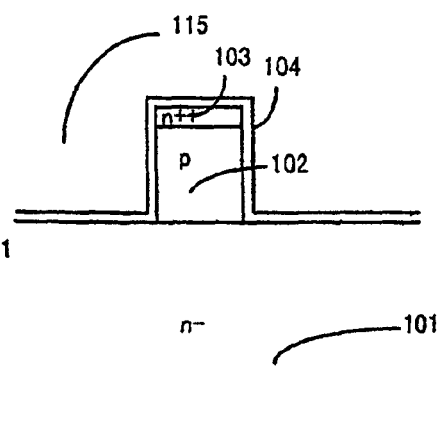
Figure 6C:
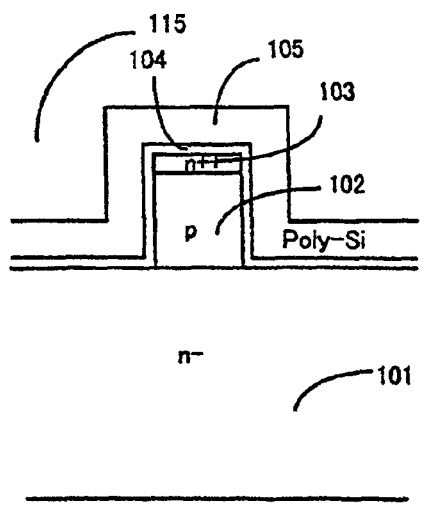
Figure 6D:
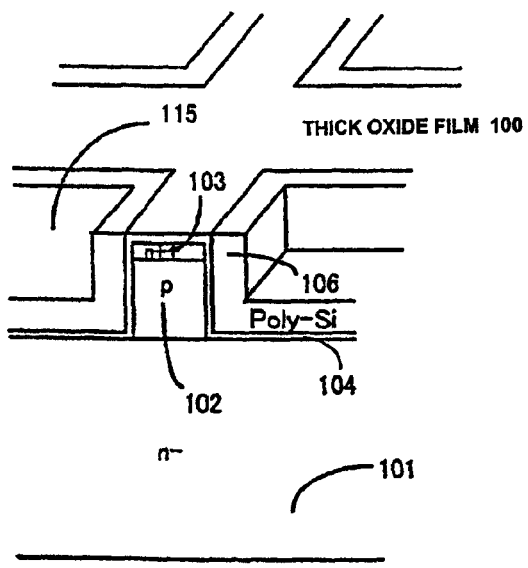
FIG. 6D is a plan view of the semiconductor wafer describing the main manufacturing step for manufacturing the 600V-NPT-IGBT according to the second embodiment.

Referring now to FIG. 6B, gate oxide film 104, 800 Å thick, is grown on the first side wall of the protruding semiconductor region in an oxidation furnace. Referring now to FIG. 6C, polysilicon layer 105 is deposited for the thickness of 0.5 μm and thermally treated in a POCl$_3$ atmosphere at 900° C. to heavily dope polysilicon layer 105 to be of an n-type.

Referring now to FIG. 6D, the surface of polysilicon layer 105 is polished by CMP. A polishing slurry that exhibits a high selective polishing ratio of the oxide film and silicon is employed to stop the polishing at the surface level of gate oxide film 104 on n$^{++}$-type emitter region 103 in the protruding semiconductor region. Remaining thick oxide film 100 functions effectively as a polishing stopper.

Figure 7A:
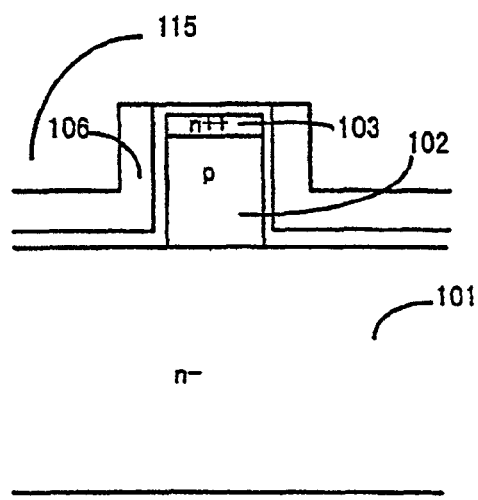
FIGS. 7A and 7B are cross sectional views of the semiconductor wafer describing the main manufacturing steps for manufacturing the 600V-NPT-IGBT according to the second embodiment.
Figure 8A:
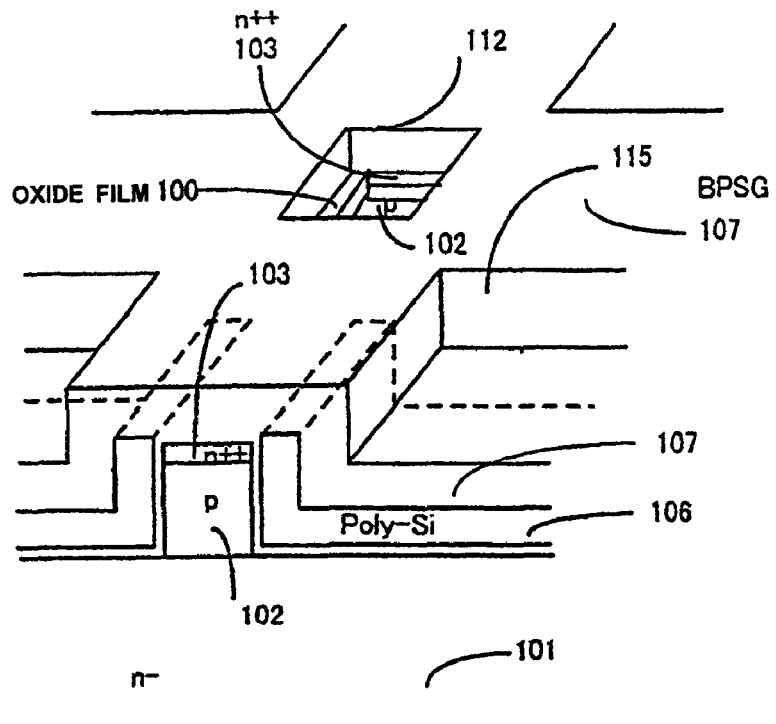
FIGS. 8A and 8B are plan views of the semiconductor wafer describing the main manufacturing steps for manufacturing the 600V-NPT-IGBT according to the second embodiment.
Figure 8B:
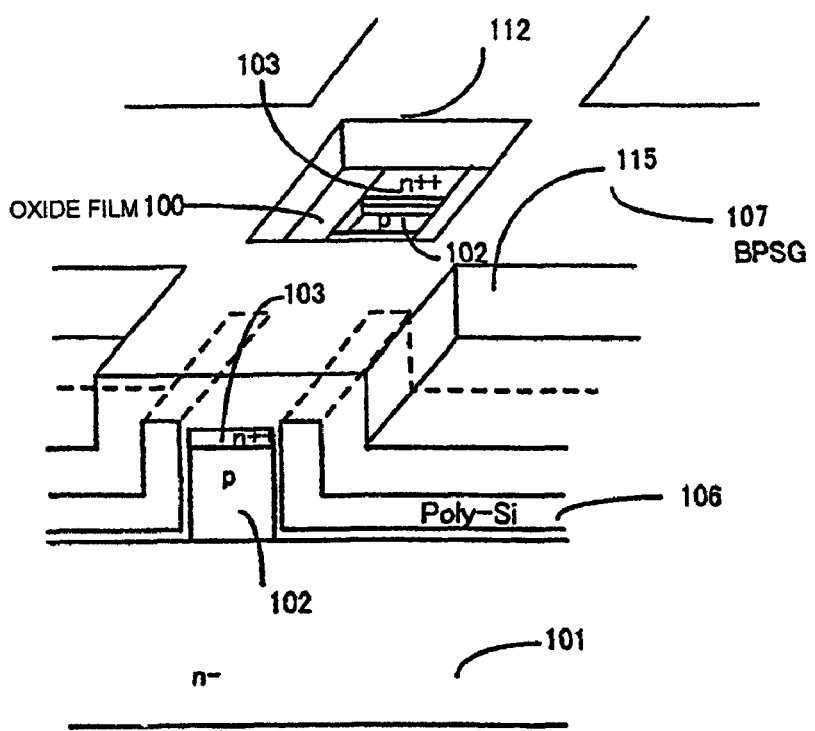

Referring now to FIG. 7A, polysilicon layer 105 on the protruding semiconductor region is polished selectively by polishing the surface of polysilicon layer 105 formed on the uneven surface of the wafer including the protruding semiconductor region. Polysilicon layer 105 left in the concave portion of the wafer by self alignment is used as polysilicon gate electrode 106. As a result, the surface step height is reduced by the polysilicon layer thickness (0.5 μm).

Referring now to FIG. 8A, interlayer insulator film 107, 1 μm thick, is coated by CVD and contact hole 112 is formed by patterning and dry-etching. Employing the photoresist used in the dry-etching and interlayer insulator film 107 as formed for a mask, n$^{++}$-type emitter region 103 in contact hole 112 is etched in an anisotropic manner for 0.5 μm from the surface thereof with a reactive ion etching (hereinafter referred to as an "RIE") etcher to expose p-type base layer (p-type epitaxial layer) 102.

Referring now to FIG. 8B, interlayer insulator film 107 in contact hole 112 is side etched, with the photoresist left unremoved, by wet-etching with a hydrofluoric acid solution (HF) and withdrawn sidewise for 0.5 μm. By the sidewise wet-etching, the surface of n$^{++}$-type emitter region 103 covered with interlayer insulator film 107 is exposed again. The photoresist is burned to ash and peeled off.

If contact holes 112 are formed with certain intervals in the extending or longitudinal direction of the stripe-shaped protruding semiconductor region, it will be possible to miniaturize the insulated gate structure. In the region in which contact hole 112 is opened, thick oxide film 100 is left unremoved in the preceding step of etching oxide film 100 (cf. FIG. 6A). Thick oxide film 100 which remains prevents emitter electrode 109 formed later from short-circuiting with polysilicon gate electrode 106.

Figure 7B:
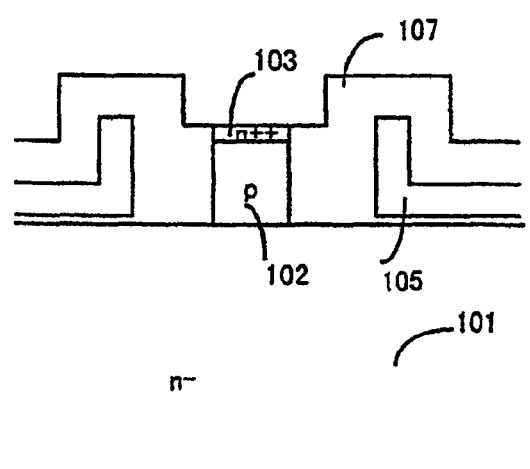

Referring now to FIG. 7B, protruding p-type epitaxial layer 102 that will serve as a guard ring is formed in the voltage blocking structure region in the chip edge area. After polysilicon layer 105 on protruding p-type epitaxial layers 102 is removed by CMP, polysilicon layer 105 left in the concave portion functions as a field plate.

Figure 9A:
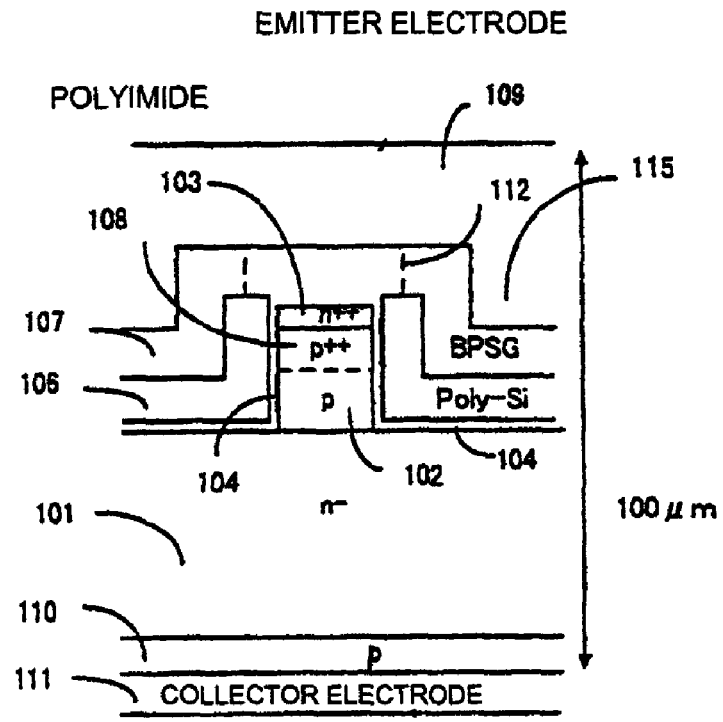
FIGS. 9A and 9B are cross sectional views of the semiconductor wafer describing the main manufacturing steps for manufacturing the 600V-NPT-IGBT according to the second embodiment.

Referring now to FIG. 9A, second p$^+$-type layer 108 is formed by implanting boron ions through contact hole 112 at the dose amount of 3×10$^{15}$ cm$^{-2}$ and under the acceleration energy of 150 keV. The implanted boron atoms are driven in a nitrogen atmosphere at 1100° C. for 30 minutes to activate the implanted impurity (boron atoms). Second p$^+$-type layer 108 is effective for reducing the contact resistance between emitter electrode 109 and p-type base layer 102, for improving the latch-up withstand or resistance, and for preventing punch-through from causing through p-type base layer 102 in the voltage blocking.

Then, aluminum is sputtered to a thickness of 5 μm to form a metal electrode film, and emitter electrode 109 is formed by photoetching. The wafer back surface is polished to set the wafer thickness at 120 μm. To remove the damage caused on the back surface side of the wafer, the silicon surface layer on the back surface side of the wafer is etched with a mixed acid to remove the damaged layer. The wet-etching reduces the wafer thickness to 100 μm. Boron ions are implanted from the back surface of the wafer at the dose amount of $1 \times 10^{14}$ cm$^{-2}$. Then, the wafer is annealed at 380° C. for 1 hour to form p-type collector layer 110.

Finally, a surface protector film is formed by polyimide coating and photoetching. An aluminum film is deposited by vacuum deposition on the wafer back surface to form collector electrode 111. If necessary, a titanium film, a nickel film and a gold film are deposited additionally by vacuum deposition to form collector electrode 111. By dicing the wafer, a semiconductor chip is completed.

Figure 9B:
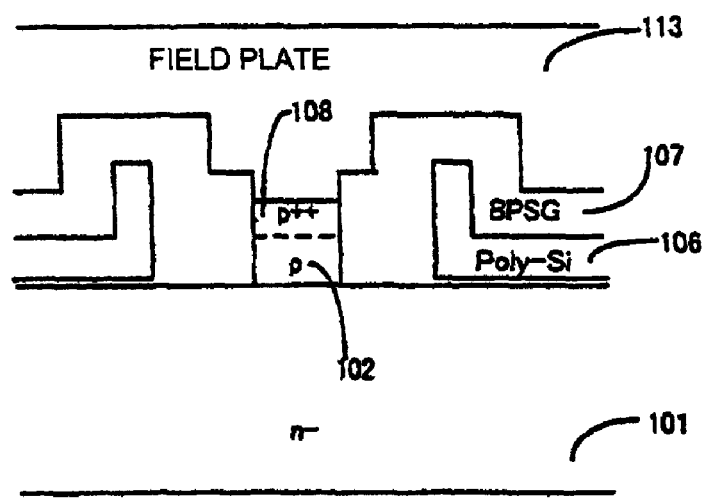

Referring now to FIG. 9B, aluminum field plate 113 is formed in the voltage blocking structure region in the chip edge area.

As described above, the manufacturing process is completed by conducting a total of four photo steps and two surface silicon CMP steps.

Figure 11:
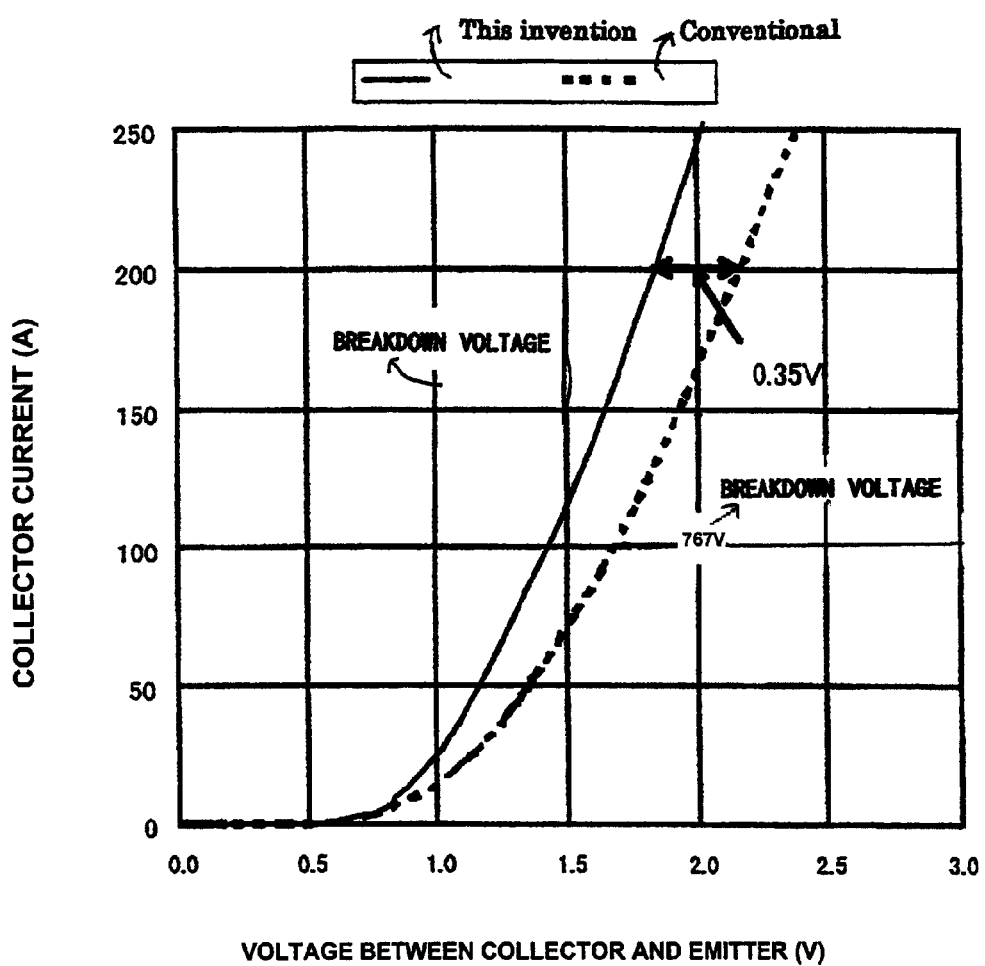
FIG. 11 shows a couple of curves comparing the output characteristics of a 600V-NPT-IGBT according to the invention and a conventional 600V-NPT-IGBT.

FIG. 11 shows a couple of curves for comparing the output characteristics of a 600V-NPT-IGBT according to the invention and a conventional 600V-NPT-IGBT.

The double-headed arrow in FIG. 11 indicates that the ON-state voltage of the IGBT according to the invention is reduced as compared with the ON-state voltage of the conventional IGBT, since the surface carrier amount in the IGBT according to the invention is larger than the surface carrier amount in the conventional IGBT. The IGBT according to the invention reduces the ON-state voltage by 0.35 V at the current density of 200 A/cm2. The cell pitch is 30 μm for the IGBT according to the invention and for the conventional IGBT. The breakdown voltage is 767 V for the conventional IGBT and 809 V for the IGBT according to the invention. It is considered that a higher breakdown voltage is obtained by the IGBT according to the invention due to the structure thereof that hardly causes electric field localization.

Now the operation and performance of the IGBTs manufactured by the methods according to the first and second embodiments of the invention will be described.

When the gate of the IGBT, the cross sectional view of which is shown in FIG. 4 or in FIG. 9A, is biased at a positive potential with respect to the emitter thereof, electrons are induced on the first side wall of p-type base layer 2 or 102 facing gate oxide film 4a or 104, forming an n-channel (not shown). An electron accumulation layer (not shown) is formed in the surface portion of n$^-$-type drift layer 1 or 101 below gate oxide film 4a or 104 between protruding p-type base layers 2 or between protruding p-type base layers 102. As electrons enter n$^-$-type drift layer 1 or 101 through the n-channel, the electrons are injected into p-type collector layer 10 or 110 on the back surface side due to field drift. The electrons injected into p-type collector layer 10 or 110 diffuse to migrate to collector electrode 11 or 111 on the back surface. Since the junction between n$^-$-type drift layer 1 and p-type collector layer 10 or the junction between n$^-$-type drift layer 101 and p-type collector layer 110 is biased forward, holes are injected from collector layer 10 or 110 into n$^-$-type drift layer 1 or 101. The holes migrate through n$^-$-type drift layer 1 or 101 due to field drift and enter p-type base layer 2 or 102.

In the 600V-NPT-IGBT or the 1200V-NPT-IGBT according to the invention, the ratio of the area of p-type base layer 2 or 102 and the emitter side surface area is small. Therefore, the area ratio of the pin-diode structure including the n-channel is large. As a result, the average carrier concentration is higher on the emitter side than on the collector side, enhancing the IE effect.

The holes as collected in the pnp-BJT region reach emitter electrode 9 or 109. The pn-junction between p-type base layer 2 and n$^-$-type drift layer 1 or the pn-junction between p-type base layer 102 and n$^-$-type drift layer 101 in the pnp-BJT region is based a little bit in reverse. The carrier concentration reduces exponentially with respect to the bias voltage.

In the IGBT according to the invention, the pnp-BJT region occupies a small part and the pin-diode region occupies the most part of the entire device area. Therefore, the region, in which the IE effect is very large and the carrier concentration is high, occupies the most part of the entire device area. Due to this, the electrical resistance is reduced and the ON-state voltage is reduced. Especially, the voltage drop in n$^-$-type drift layer 1 or 101, which shares the most part of the ON-state voltage in the IGBT exhibiting a high breakdown voltage, is minimized at a certain turnoff loss.

In the blocking mode of operation in the IGBT according to the invention, in which a forward bias voltage is applied between the collector and emitter while the gate potential is set to be equal to or negative with respect to the emitter potential, a depletion layer expands from the pn-junction between p-type base layer 2 and n$^-$-type drift layer 1 or from the pn-junction between p-type base layer 102 and n$^-$-type drift layer 101. In the blocking mode of operation in the IGBT according to the invention, another depletion layer expands also from the gate oxide film, since gate electrode 6 or 106 is biased at a potential almost the same with the emitter potential while n$^-$-type drift layer 1 or 101 is biased at a positive potential. Since the depletion layer expands flat, the electric field strength is prevented from peaking locally. Therefore, local avalanche breakdown is caused more hardly in the IGBT according to the invention than in the conventional trench-gate IGBT, in which electric field localization is liable to occur in the vicinity of the trench bottom. Therefore, the IGBT according to the invention facilitates securing a sufficient breakdown voltage. As a result, the IGBT according to the invention facilitates improving the breakdown voltage thereof as compared with the conventional planer-gate IGBT and the conventional trench-gate IGBT. Since the IGBT according to the invention facilitates using a thinner wafer for obtaining the same breakdown voltage, it is possible for the IGBT according to the invention to further reduce the ON-state voltage.

The IGBT according to the invention is manufactured based on the process of manufacturing the IGBT having a planar-gate structure. Now the manufacturing process will be described below.

A p-type epitaxial layer 2 or 102 is grown on n-type FZ substrate 1 or 101. Next, p-type epitaxial layer 2 or 102 outside the protruding semiconductor region is removed by dry-etching or by anisotropic etching using an alkali (basic material) to isolate the protruding semiconductor region. Then, a MOS structure is formed in the protruding semiconductor region.

Gate electrode 6 or 106 can be formed by photoetching after depositing polysilicon layer 5 or 105 in the same manner as through the process for manufacturing the conventional planar-gate IGBT. Alternatively, by polishing the surface of deposited polysilicon layer 5 or 105, gate electrode 6 or 106 may be formed by self-alignment without conducting any photo step. The formation of gate electrode 6 or 106 by the self-alignment technique is advantageous, since the surface step on the wafer major surface is lowered a little bit.

Still alternatively, n-type FZ substrate 101 is oxidized initially. An opening is bored through a part of oxide film 100 by dry-etching and p-type base layer 102 is grown by selective epitaxial growth in the opening. After polishing the wafer surface, the oxide film is removed and a gate oxide film is formed on the surface of p-type base layer 102 by thermal oxidation. After depositing polysilicon layer 105, the surface thereof is polished to form gate electrode 106 by self-alignment. Then, $n^{++}$-type emitter region 3 and such a region are formed in the surface portion of p-type base layer 102 to form a MOS structure.

Figure 12:
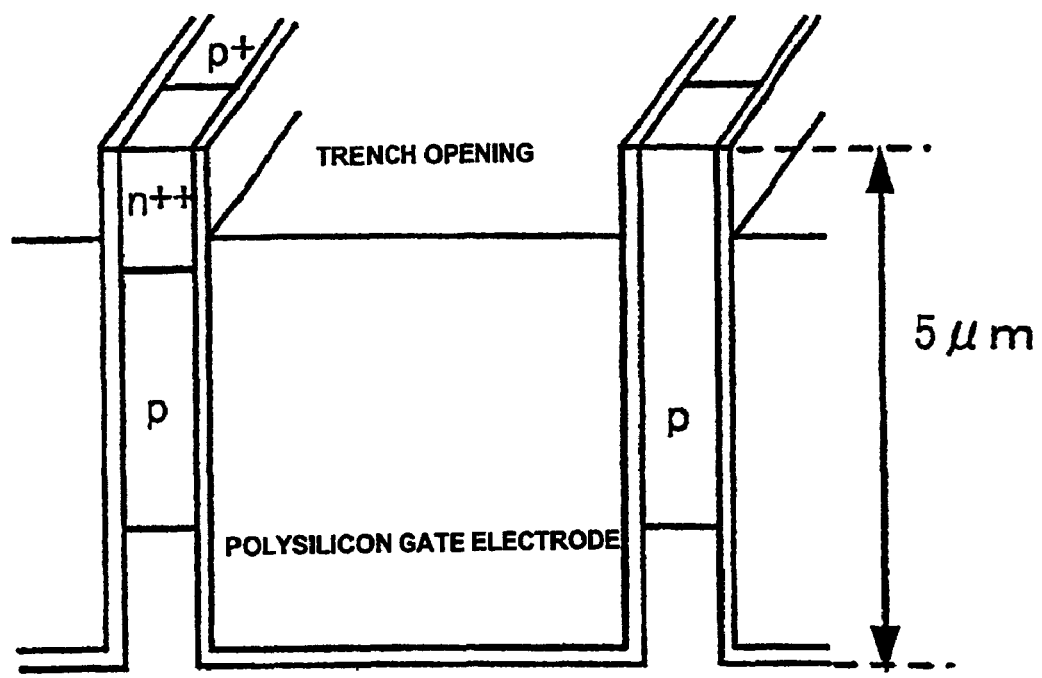
FIG. 12 is a plan view of the semiconductor wafer of an improved conventional trench-gate IGBT.

In the conventional trench-gate IGBT, it is possible theoretically to enhance the IE effect by adopting a wide trench structure, in which the trench opening is widened and the mesa section is narrowed as shown in FIG. 12, further to improve the tradeoff relation between the ON-state voltage and the turnoff loss. However, the structure described above is not practical, since the structure described above has the problems as described below in its manufacture.

Figure 13:
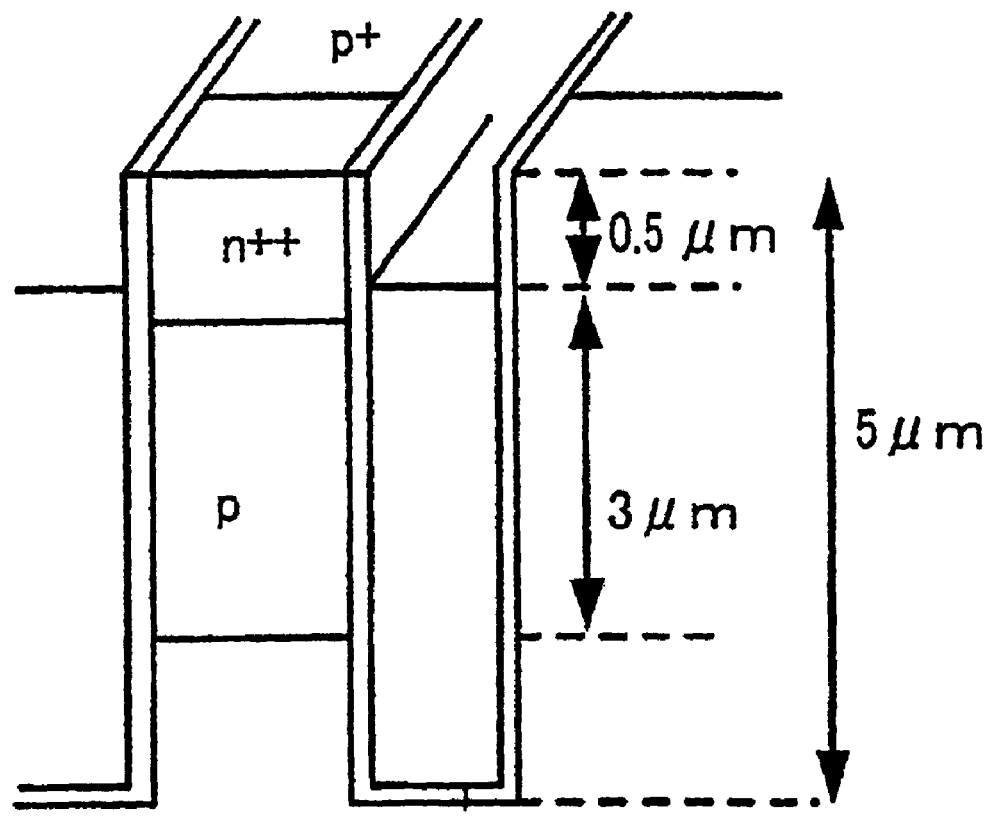
FIG. 13 is a plan view of the semiconductor wafer of a conventional trench-gate IGBT.

Since it is necessary for the trench in the conventional and normal trench gate structure to be about 5 μm deep as shown in FIG. 13 (as compared with the trench step less than 2 μm according to the invention), it is necessary to fill the trench formed by etching completely with a polysilicon layer. It is necessary for the conventional trench-gate IGBT to have such a deep trench to secure a sufficient integral dose amount for the p-type base layer, to suppress the limited current by securing a certain channel length and to predict the height of the polysilicon layer (around 0.5 μm) reduced by the etching back of the polysilicon layer buried in the trench.

If the integral dose amount is insufficient, the depletion layer will develop into the p-type base layer in the forward voltage blocking and reach through to the emitter electrode. Therefore, a predetermined breakdown voltage, especially a high breakdown voltage, will not be obtained. If polysilicon is not buried in the trench as deep as the depth thereof, a step as deep as 5 μm, which is the depth of the trench, will be caused. The step caused will cause the problems such as uneven thickness and insufficient coverage of the photoresist spin-coated in the succeeding steps.

When a wide trench structure including a wide opening as shown in FIG. 12 and a trench as deep as the trench in the conventional trench gate structure shown in FIG. 13 are combined, the step load for filling the trench completely will be very heavy. To completely fill a trench that is 10 μm wide and 5 μm deep with a polysilicon layer, it is necessary to deposit the polysilicon layer for more than 5 μm. The treatment time for filling the 5 μm deep trench with a polysilicon layer will be 10 times as long as depositing the polysilicon layer for the ordinary gate electrode, 0.5 μm thick. The maintenance of the polysilicon CVD furnace is conducted periodically once every 10 μm deposition of polysilicon. Therefore, it will be necessary to conduct maintenance (to remove the materials deposited in the tubes) once every 2 batches. However, it is impractical to conduct maintenance once every 2 batches. Moreover, it is necessary to remove the excessive polysilicon layer caused over the trench. Since a polysilicon layer, the thickness of which is 5 μm which is about half the trench width, is deposited on the wafer surface outside the trench, it is necessary to remove the polysilicon layer deposited on the wafer surface outside the trench.

In conclusion, it is easy to apply the etching-back technique to the ordinary trench that is deep and narrow. However, it is not practical to apply the etching-back technique to the trench that is deep and wide.

Trench 15 and trench 115 according to the invention are featured by the shape thereof, wide and about 2 μm deep. (Hereinafter the structure of the trench described above will be referred to sometimes as the "shallow and wide trench structure"). The reason for this will be described below.

Since a p-type epitaxial layer is employed for p-type base layer 2 according to the invention, a sufficient dose amount will be secured, even if p-type base layer 2 is thinner than the p-type base layer formed by diffusion. If the surface p-type impurity concentration in the p-type base layer formed by diffusion in the planar-gate IGBT is $2\times10^{17}$ cm$^{-3}$, the vertical integral dose amount will be $2.7\times10^{13}$ cm$^{-2}$ for the junction depth Xj of 4 μm and the lateral integral dose amount will be $2.2\times10^{12}$ cm$^{-3}$ assuming the 80% of the vertical integral dose amount. For obtaining the same dose amounts by the p-type epitaxial layer, the impurity concentration thereof is $2\times10^{17}$ cm$^{-3}$, it is enough to set the junction depth Xj to be 1.1 μm.

According to the first and second embodiments of invention, the polysilicon layer for the gate electrode is not etched back but the excessive portion thereof is removed by the CMP described above. Therefore, it is possible to make the level of the polysilicon layer surface coincide with the level of the protruding semiconductor region surface. Therefore, the polysilicon layer can be used as the MOS channel from the level the same with the level of the protruding semiconductor region surface. As a result, it is not necessary to drive in arsenic as in the conventional trench-gate IGBT, and, therefore, it is possible to further reduce the trench depth.

In addition to reducing the trench depth, the surface step is further reduced by depositing polysilicon layer 5 of about 0.5 μm in thickness and by polishing polysilicon layer 5 deposited to form gate electrode 6. Therefore, the subsequent steps may be conducted advantageously without intentionally filling trench 15 or trench 115 and not in the same manner as according to the prior art.

Figure 14:
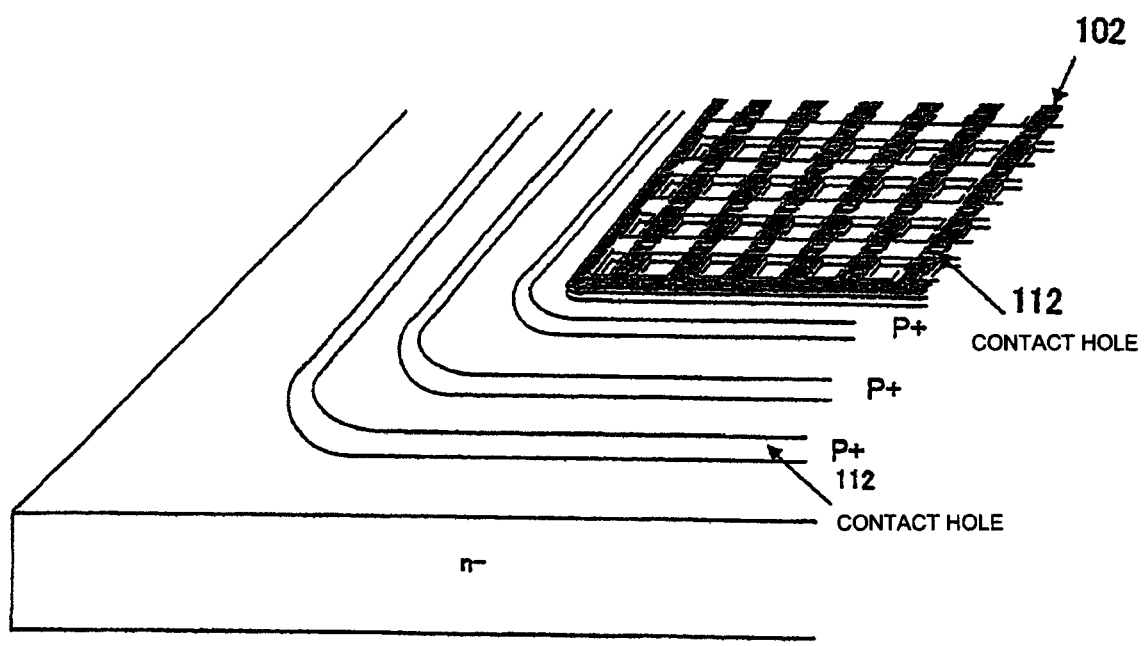
FIG. 14 is a plan view showing an active region and a voltage blocking structure region in a semiconductor chip according to the invention.

FIG. 14 is a plan view showing an active region and a voltage blocking structure region, in which contact holes 112 are formed, in a semiconductor chip according to the invention.

As described above, the IGBTs according to the first and second embodiments of the invention exhibit the IE effects, which the conventional trench-gate IGBT shown in FIG. 12 exhibits, with the shallow and wide trench structure employed therein. The IGBTs according to the first and second embodiments that employ the shallow and wide trench structure exhibit the IE effects, as effective as those of the trench-gate IGBT that employs a deep and wide trench structure, without causing any very heavy step load for treating a thick polysilicon layer but with very low manufacturing costs.

Third Embodiment

Figure 17B:
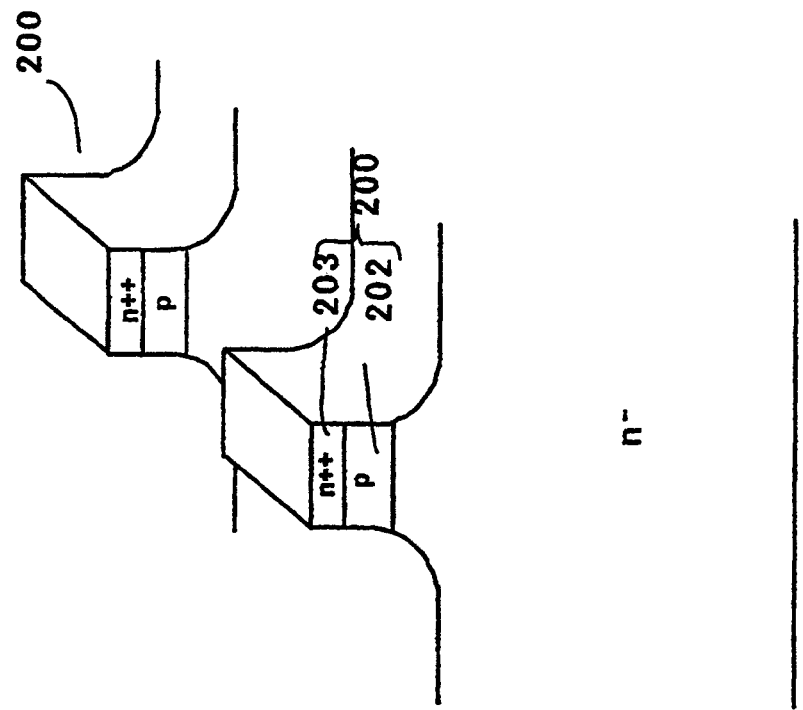
FIG. 17B is a plan view of the semiconductor wafer describing the main manufacturing step for manufacturing the 1200V-FS-IGBT according to the third embodiment.

FIGS. 15A, 15B, 16A, 17A, 18A, and 18B are cross sectional views of a semiconductor wafer describing the main manufacturing steps for manufacturing a field-stop-type IGBT exhibiting a rated breakdown voltage of 1200V (hereinafter referred to as a "1200V-FS-IGBT") according to a third embodiment of the invention. FIGS. 17B and 19A are plan views of a semiconductor wafer describing the main manufacturing steps for manufacturing the 1200V-FS-IGBT according to the third embodiment. FIGS. 16B, 19B, 20, 21, and 22 are explanatory drawings, each including a top plan view and cross sectional views of a semiconductor wafer, for describing the main manufacturing steps for manufacturing the 1200V-FS-IGBT according to the third embodiment.

Now the manufacturing steps for manufacturing the 1200V-FS-IGBT according to the third embodiment of the invention will be described below with reference to these drawings.

Figure 15B:
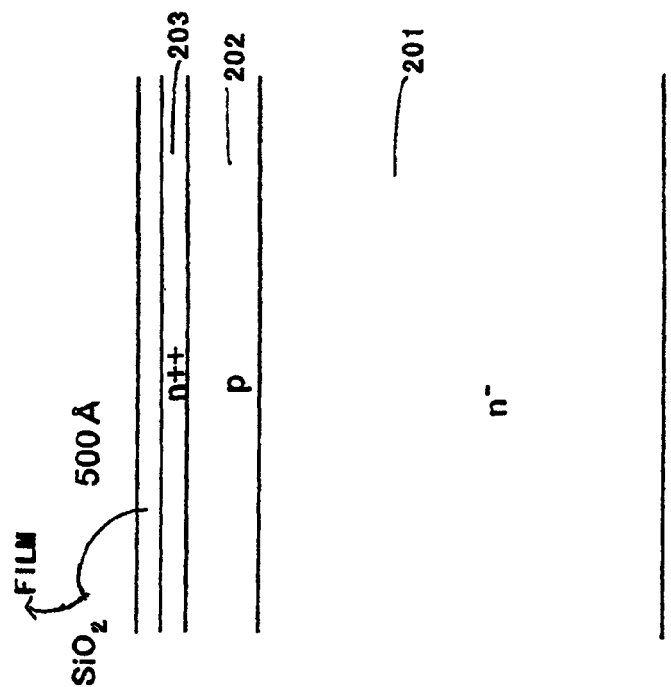
FIGS. 15A and 15B are cross sectional views of a semiconductor wafer describing the main manufacturing steps for manufacturing a field-stop-type IGBT exhibiting a rated breakdown voltage of 1200V (hereinafter referred to as a "1200V-FS-IGBT") according to a third embodiment of the invention.
Figure 15A:
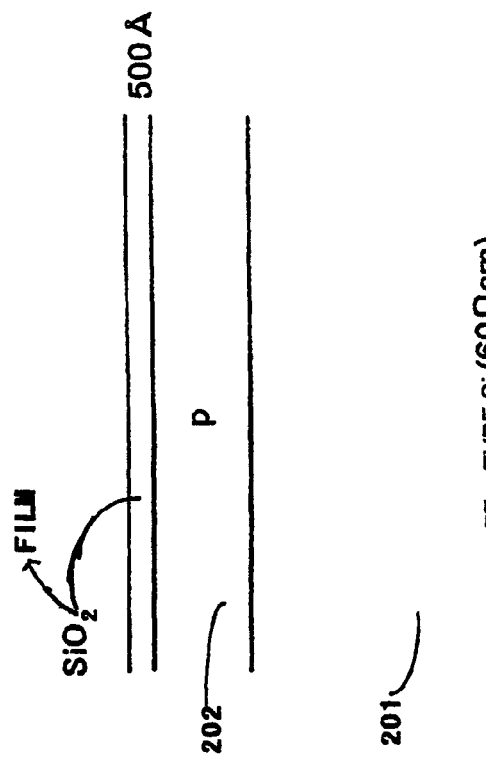

Referring now to FIG. 15A, n-type FZ silicon substrate 201, having a (100) major surface and exhibiting the resistivity of 60 Ωcm, is prepared for a starting material. A thermal oxide film (hereinafter referred to simply as an "oxide film"), 500 Å thick, is grown on n-type FZ silicon substrate 201. Boron ions are implanted at the dose amount of $4\times10^{13}$ cm$^{-2}$ and under the acceleration energies of 100 keV and 200 keV separately. By the double boron implantation, the boron concentration peaks at the depths of 0.3 µm and 0.6 µm from the wafer surface and the impurity concentration distribution in the depth direction of p-type base layer 202 are made to be uniform.

Referring now to FIG. 15B, arsenic ions are implanted at the dose amount of $5\times1015$ cm 2 and under the acceleration energy of 150 keV to form n$^{++}$-type emitter region 203. Then, the wafer is annealed at 900° C. for 20 minutes to recover the crystal defects caused by the ion implantation.

Referring now to FIG. 16A, resist 213, shaped with a planar stripe 2 µm wide, is formed on the oxide film on silicon substrate 201 by patterning and etching, and the oxide film is etched using resist 213. If described in detail, the stripes of resist 213 extend in parallel to each other with intervals of 30 µm on the oxide film, although not illustrated.

Referring now to FIG. 16B, each stripe of resist 213 is divided at an equal interval in the extending or longitudinal direction thereof such that islands of resist 213 are aligned in a stripe pattern. A rectangular island of resist 213 is 4 µm long. In FIG. 16B, the planar pattern of an island-shaped oxide film formed by etching the oxide film, 500 Å thick, with an oxide-film dry-etcher using the island-shaped resist for a mask is shown by hatching. The resist is not shown in FIG. 16B. The cross sectional views of the island-shaped oxide film (illustrated by hatching) along the single-dotted-chain lines A and B are shown on the underside of the top plan view thereof in FIG. 16B and designated by the reference symbols A and B. The cross sectional view of the island-shaped oxide film along the single-dotted-chain line X is shown on the right hand side of the top plan view thereof in FIG. 16B and designated by the reference symbol X.

Figure 17A:
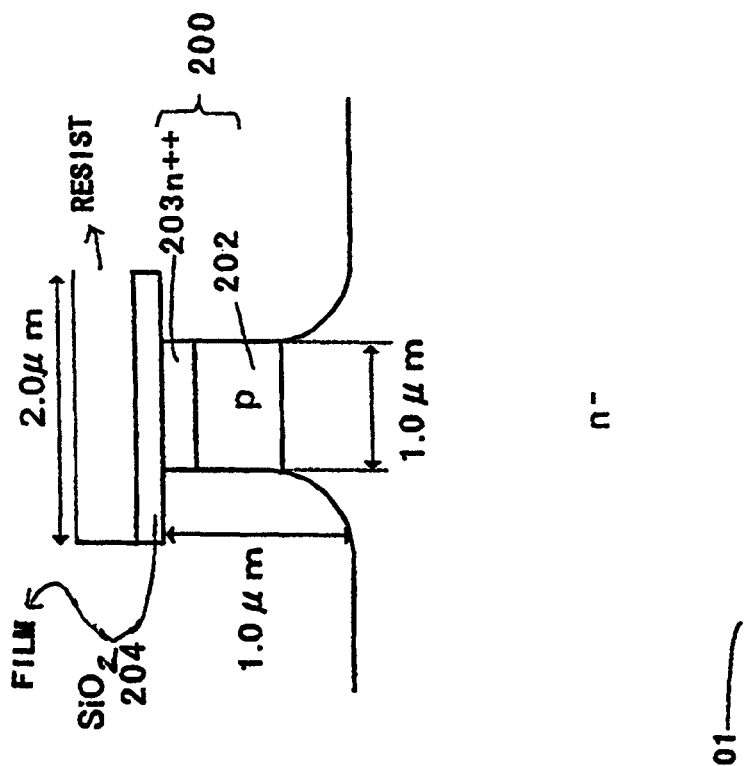
FIG. 17A is a cross sectional view of the semiconductor wafer describing the main manufacturing step for manufacturing the 1200V-FS-IGBT according to the third embodiment.

Referring now to FIG. 17A, the exposed portion of silicon is etched and dug for 1 µm with an isotropic dry-etcher using resist 213 and the oxide film pattern described above for a mask. Due to the isotropic etching, the portions of silicon under oxide film 204 are also etched.

Referring now to FIG. 17B, resist 213 is removed. From above, rectangular p-type protrusions 200, each including n$^{++}$-type emitter region 203 in the surface portion thereof, are scattered with equal intervals. The p-type protrusion 200 corresponds to the protruding semiconductor region according to the first and second embodiments.

Figure 18A:
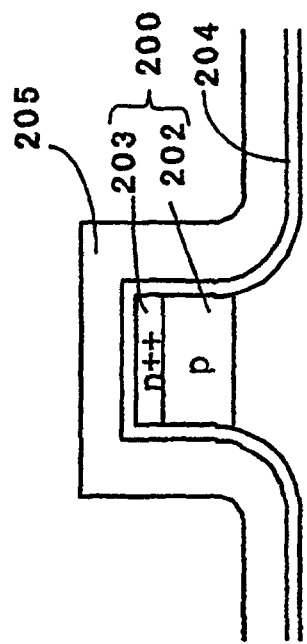
FIGS. 18A and 18B are cross sectional views of the semiconductor wafer describing the main manufacturing steps for manufacturing the 1200V-FS-IGBT according to the third embodiment.

Referring now to FIG. 18A, gate oxide film 204, 1000 Å thick, is grown by thermal oxidation such that gate oxide film 204 is covering n$^{++}$-type emitter region 203 shown in FIG. 17B.

Figure 18B:
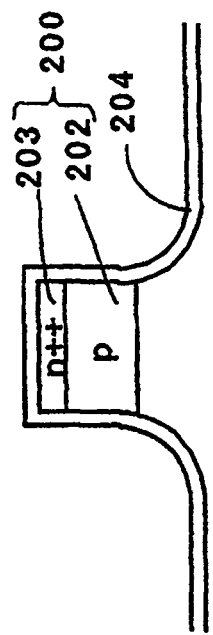
Figure 25:
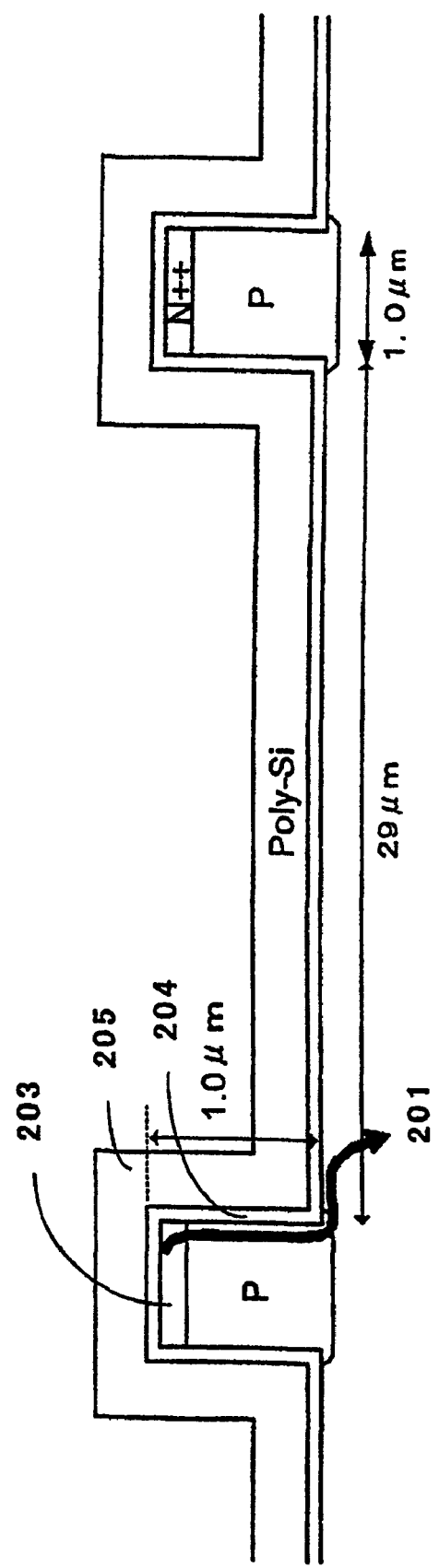
FIG. 25 a cross sectional view of the semiconductor wafer describing the p-type protrusions arranged in parallel to each other at a pitch of 30 μm according to the third embodiment of the invention.

Referring now to FIG. 18B, polysilicon layer 205, 5000 Å thick, is formed on gate oxide film 204. A cross sectional view, in which p-type protrusions 200 shown in FIG. 18B are arranged in parallel at a pitch of 30 µm, is shown in FIG. 25. The arrow in FIG. 25 indicates the path of electron flow and the direction thereof.

Referring now to FIGS. 19A and 19B, polysilicon layer 205 remains on gate oxide film 204 by patterning and etching such that polysilicon layer 205 crosses over the central portion of rectangular p-type protrusion 200. Polysilicon layer 205 is removed leaving gate oxide film 204 behind on the other portion of rectangular p-type protrusion 200. Since rectangular p-type protrusion 200 is 1 µm high at most, the step as high as 1 µm does not cause the problems such as nonuniform resist coating and anomalous patterning. However, rectangular p-type protrusion 200 higher than 2 µm is not preferable, since the problems such as nonuniform resist coating and anomalous patterning will be caused with a high probability. Since polysilicon layer 205 crosses over the central portion of p-type protrusion 200, the central portion on the surface side of n$^{++}$-type emitter region 203 in p-type protrusion 200 is covered in the width direction thereof with polysilicon layer 205 via gate oxide film 204.

By making polysilicon layer 205 cross over the central portion of p-type protrusion 200, the gate voltage applied to polysilicon layer 205 is prevented from varying and made to be uniform in the active region in the wafer. As a positive bias voltage is applied to polysilicon gate electrode 205, n$^{++}$-type emitter region 203 and an n-channel formed in p-type base layer 202 are connected with each other securely, resulting in a current path. Since an electron current path is formed securely, the device is brought into the ON-state thereof. The electron current reaches n$^-$-type drift layer 201, as indicated by the arrow in FIG. 25, from emitter electrode 208, shown in FIG. 22 and in contact with n$^{++}$-type emitter region 203 at the end of p-type protrusion 200 in the extending or longitudinal direction thereof, via n$^{++}$-type emitter region 203 in the central portion of p-type protrusion 200 and the n-channel described above. In FIGS. 19B through 22, the cross sectional views along the single-dotted chain lines A, B, and C across the top plan view of p-type protrusion 200, illustrated by hatching, are shown on the underside of the top plan view thereof and designated by the reference symbols A, B, and C. The cross sectional view along the single-dotted chain line X across the top plan view of p-type protrusion 200 is shown on the right hand side of the top plan view thereof and designated by the reference symbol X.

Figure 20:
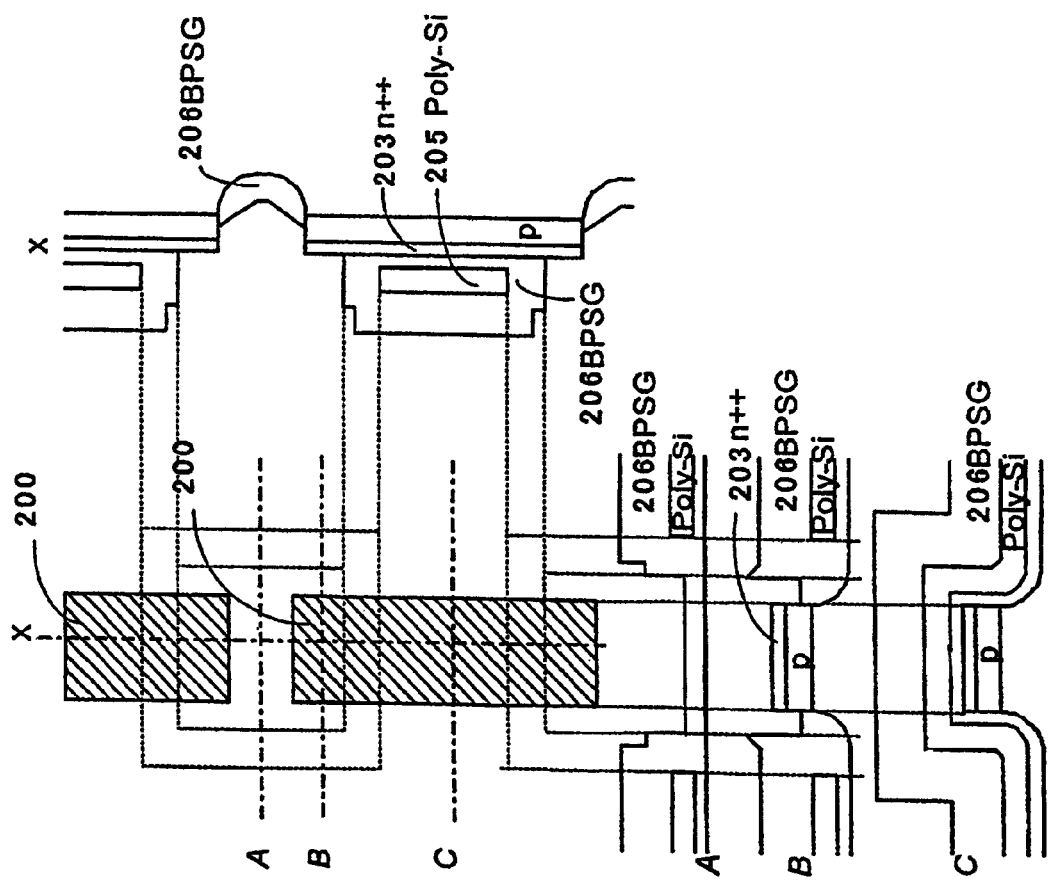
FIG. 20 is an explanatory drawing including a top plan view and four cross sectional views of the semiconductor wafer for describing the main manufacturing step for manufacturing the 1200V-FS-IGBT according to the third embodiment.

Referring now to FIG. 20, borophosphosilicate glass (hereinafter referred to as "BPSG") is deposited by CVD for an interlayer insulator film. The region between p-type protrusions 200 (illustrated by hatching) adjoining in the extending or longitudinal direction of the stripes thereof is made to be thick, since BPSG film 206 is deposited also from the second side walls of p-type protrusions 200.

Figure 21:
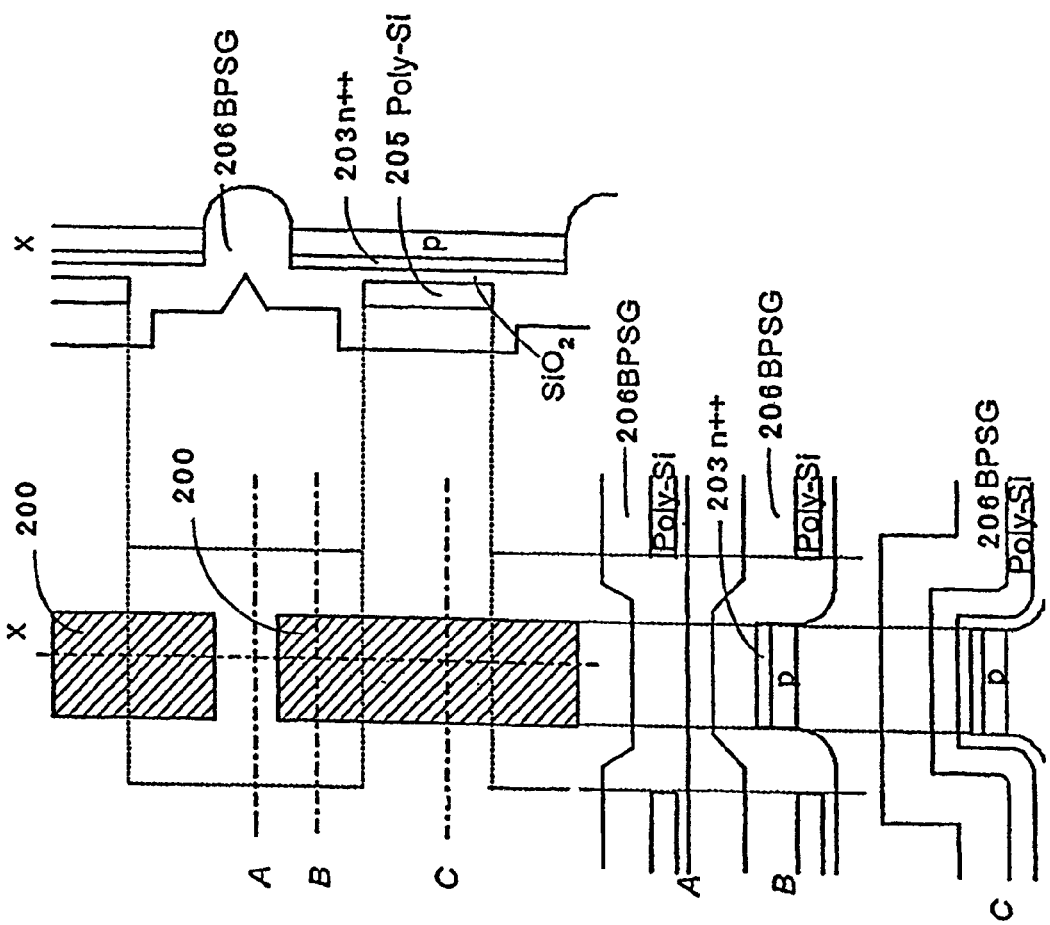
FIG. 21 is an explanatory drawing including a top plan view and four cross sectional views of the semiconductor wafer for describing the main manufacturing step for manufacturing the 1200V-FS-IGBT according to the third embodiment.

Referring now to FIG. 21, BPSG film 206 is etched with a dry-etcher. In the end portion of p-type protrusion 200, in which BPSG film 206 is thin, BPSG film 206 is removed completely such that silicon is exposed. Since BPSG film 206 remains in the portion of p-type protrusion 200, in which BPSG film 206 is thick, silicon is not exposed.

Figure 22:
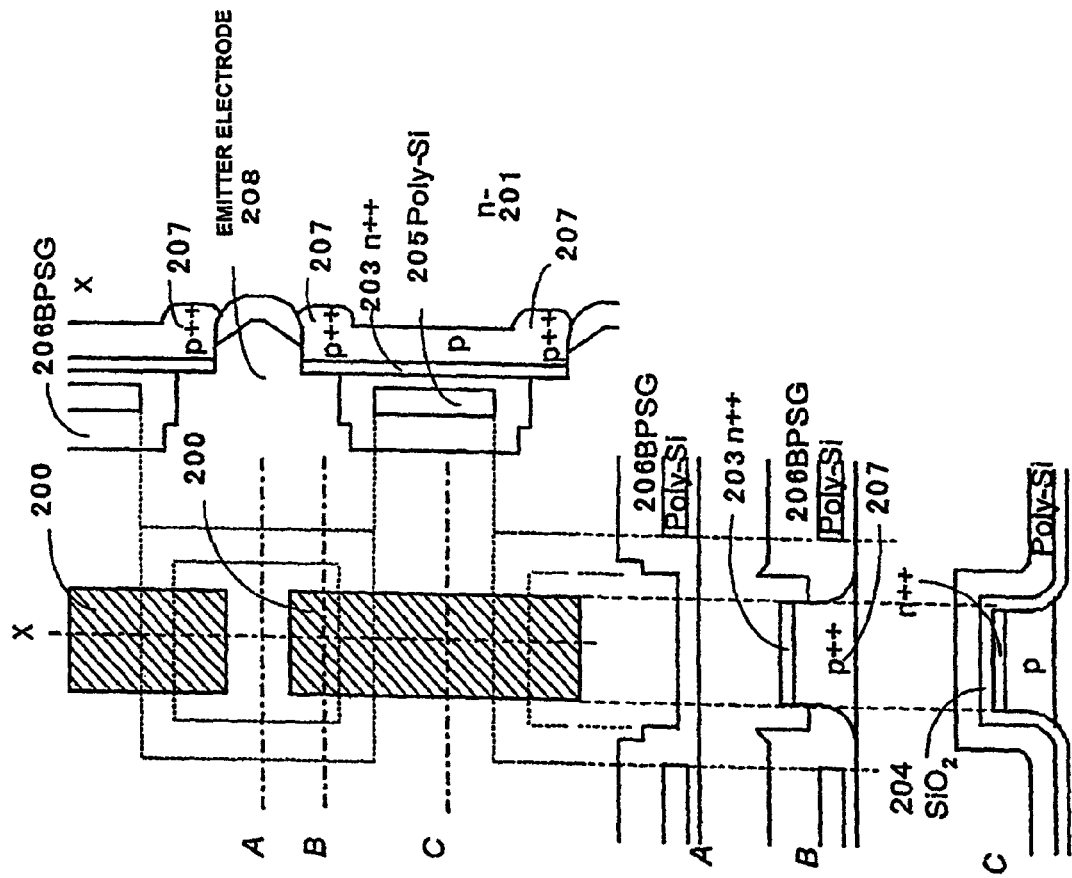
FIG. 22 is an explanatory drawing including a top plan view and four cross sectional views of the semiconductor wafer for describing the main manufacturing step for manufacturing the 1200V-FS-IGBT according to the third embodiment.

Referring now to FIG. 22, heavily doped p$^{++}$-type region 207 is formed in the end portion of p-type protrusion 200 by implanting boron ions at the dose amount of $3\times10^{15}$ cm$^{-2}$ and under the acceleration energy of 120 keV for reducing the contact resistance and for improving the latch-up withstand or resistance. Since BPSG film 206 remains in the region between p-type protrusions 200 adjoining in the extending or longitudinal direction of the stripes thereof, boron ions are not implanted to silicon.

Figure 24:
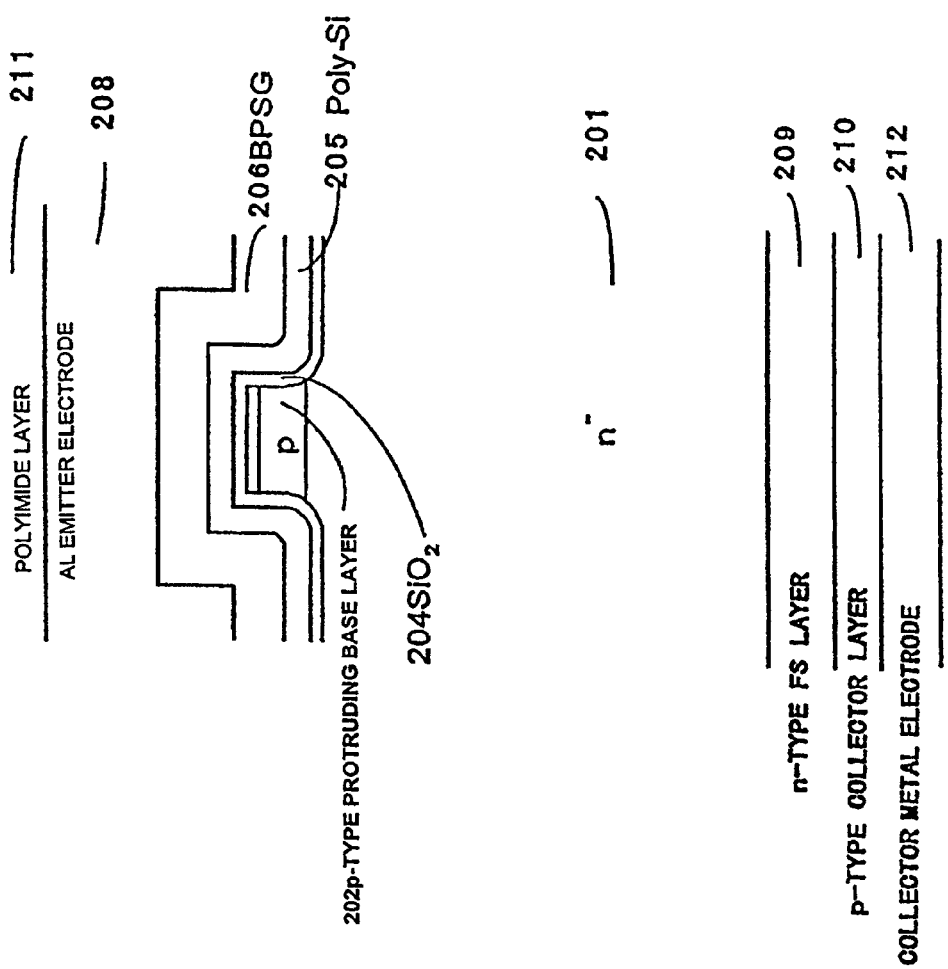
FIG. 24 is a cross sectional view of the 1200V-FS-IGBT according to the third embodiment.

Referring now to FIG. 24, an Al—Si metal film is deposited by sputtering. The Al—Si metal film is patterned and etched to form electrodes on the emitter, the gate and the voltage blocking region. (The electrodes other than emitter electrode 208 are not shown in FIG. 24.) Then, the back surface side of the semiconductor wafer is polished by grinding so that the wafer may be 130 μm thick. Phosphorus ions and boron ions are implanted to the wafer back surface to form n-type FS layer 209 and p-type collector layer 210. Polyimide film 211 is coated by spin-coating for a surface protector film. Polyimide film 211 is patterned and etched to form an electrode pad structure (not shown). Finally, collector metal electrode 212, having a four-layered laminate structure consisting of an aluminum film, a titanium film, a nickel film, and a gold film, is formed by vacuum deposition or by sputtering. Thus, a wafer process is completed. The wafer completed as described above is cut into chips having a predetermined size and the chips of the 1200V-FS-IGBT are completed. The manufacture of the chip of the 1200V-FS-IGBT ends after conducting total of five of photoetching steps through the wafer process described above.

Now the operations of the 1200V-FS-IGBT according to the third embodiment will be described below with reference to FIG. 24.

As the gate is biased at a positive potential with respect to the emitter, electrons are induced on the first side wall of p-type protruding base layer 202 in contact with gate oxide film 204 and a channel (not shown) is formed. And, an electron accumulation layer is formed on the surface of n-type silicon (n$^-$-type drift layer 201) in contact with gate electrode 204. As electrons enter n$^-$-type drift layer 201 through the channel formed, the electrons drift toward the back surface of the chip and are injected to p-type collector layer 210 on the back surface side via n-type FS layer 209. The electrons injected to p-type collector layer 210 move to metal collector electrode 212 on the back surface side of the chip by diffusion.

Since the junction between n$^-$-type drift layer 201 and p-type collector layer 210 is biased in forward, hole are injected from the collector. The hole injected move in n$^-$-type drift layer 201 toward the front surface of the chip and enter p-type protruding base layer 202. Then, the holes slip through to emitter electrode 208 from p-type protruding base layer 202. Since carriers including the electrons and holes are injected, the inside of n$^-$-type drift layer 201 is brought into a heavily injected state and, therefore, the electrical resistance of n$^-$-type drift layer 201 is reduced.

As shown in FIG. 25, the stripe width of p-type protruding base layer 202 is 1 μm and the width of the region, in which any protruding structure is not, is 29 μm according to the third embodiment. Since the area ratio of p-type protruding base layer 202 is very small, large IE effects are obtained in the same manner as by the conventional 1200V-FS-IGBT. For obtaining excellent IE effects, it is preferable for the stripe width of p-type protruding base layer 202 to be narrower than the width of the region, in which any protruding structure is not.

Figure 23:
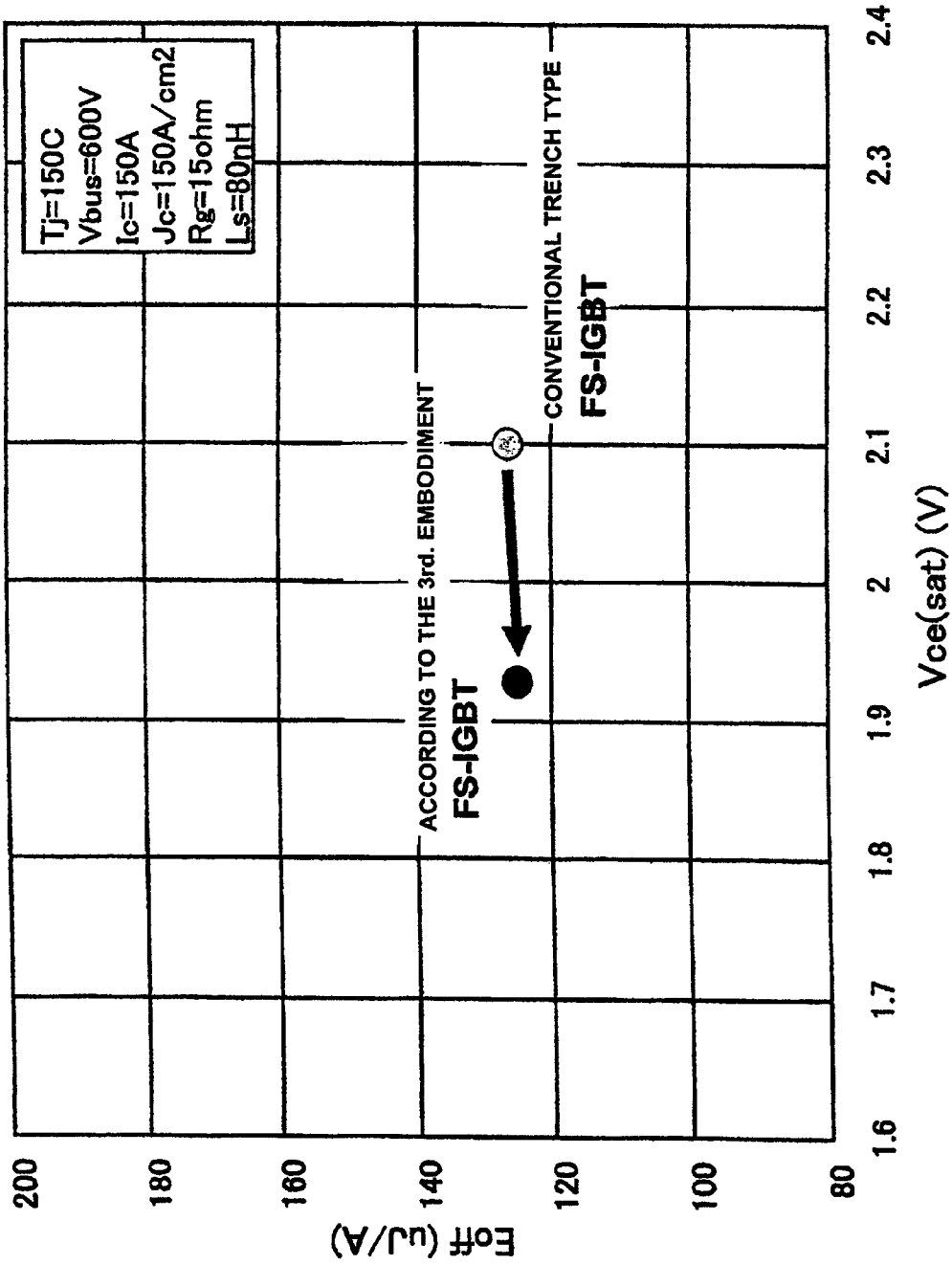
FIG. 23 compares the tradeoff characteristics between the ON-state voltage and the turnoff loss of the 1200V-FS-IGBT according to the third embodiment of the invention with the tradeoff characteristics of the conventional 1200V-FS-IGBT.

FIG. 23 compares the tradeoff characteristics between the ON-state voltage and the turnoff loss of the 1200V-FS-IGBT according to the third embodiment of the invention with the tradeoff characteristics of the conventional 1200V-FS-IGBT. In FIG. 23, the vertical axis represents the turnoff losses and the vertical axis the ON-state voltages.

The results described in FIG. 23 indicate that the 1200V-FS-IGBT according to the third embodiment that has a shallow and wide trench structure reduces the ON-state voltage by 0.18 V as compared at the same chip area with the conventional trench-gate IGBT. Since a larger amount of carries is accumulated on the chip surface side in the 1200V-FS-IGBT according to the third embodiment than in the normal trench-gate IGBT according to the prior art, the 1200V-FS-IGBT according to the third embodiment facilitates improving the tradeoff characteristics.

The p-type protruding base layer 202 is divided in the extending or longitudinal direction of the stripe thereof according to the third embodiment. Heavily doped p$^{++}$-type region 207 and n$^{++}$-type emitter region 203 are exposed to the second side walls of p-type protrusion 200 that intersect the extending or longitudinal direction of the stripe thereof as shown in the cross sectional view along the single-dotted-chain line X shown in FIG. 22. Therefore, it is possible for heavily doped p$^{++}$-type region 207 and n$^{++}$-type emitter region 203 to be in contact with emitter electrode 208 via the exposed portions thereof without causing any additional step.

By appropriately selecting the cutout length of p-type protruding base layer 202 cut out in dividing p-type protruding base layer 202 in the extending or longitudinal direction of the stripe thereof, interlayer insulator film 206 that will fill the cutout caused in p-type protruding base layer 202 may be thickened. Since an insulator film may be left after p-type protruding base layer 202 is etched, excessive formation of heavily doped p$^{++}$-type region 207 on the exposed silicon wafer surface is prevented from causing. As a result, the area ratio of p-type protruding base layer 202 is lowered, and, therefore, the IE effects are further improved as compared with the conventional IGBT having the conventional wide trench structure shown in FIG. 12.

Since the manufacturing method according to the third embodiment forms p-type protruding base layer 202 not by epitaxial growth but by boron ion implantation into an n-type FZ silicon substrate, the manufacturing method according to the third embodiment facilitates reducing the wafer costs as compared with the manufacturing methods according to the first and second embodiments. Since n-type FS layer 209 is interposed between p-type collector layer 210 and n$^-$-type drift layer 201, the thickness of n$^-$-type drift layer 201 in the semiconductor device according to the third embodiment is made to be thinner than the thickness of n$^-$-type drift layer in the NPT-type IGBTs according to the first and second embodiments. Therefore, the ON-state voltage is made to be lower according to the third embodiment.

Thus, a power semiconductor device and manufacturing method therefor have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on and claims priority to Japanese Patent Application 2008-289716, filed on Nov. 12, 2008. The disclosure of the priority application in its entirety, including the drawings, claims, and the specification thereof, is incorporated herein by reference.

What is claimed is:
1. A semiconductor device comprising:
a semiconductor substrate of a first conductivity type comprising a first major surface;
at least one pair of trenches extending in parallel to each other and formed from the first major surface;
a protruding semiconductor region between the pair of trenches, the protruding semiconductor region being narrower than the trenches;
a base layer of a second conductivity type in the protruding semiconductor region;
a region of the first conductivity type on a surface side of the base layer;

a gate insulator film on a first side wall of the protruding semiconductor region;

a gate electrode on the gate insulator film;

the protruding semiconductor region being from 0.5 μm to 3.0 μm in short side width;

the trench being from 0.5 μm to 3.0 μm in depth;

the trench being 1.0 μm or longer in short side width;

the trench being wider than the protruding semiconductor region in the short side widths thereof;

the gate electrode comprising electrically conductive polycrystalline silicon as a main component thereof; and the gate electrode being from 0.2 μm to 1.0 μm in thickness.

2. The semiconductor device according to claim 1, wherein the base layer comprises an epitaxial semiconductor layer.

3. The semiconductor device according to claim 1, wherein the base layer comprises a layer formed by ion implantation.

4. The semiconductor device according to claim 3, wherein the layer formed by ion implantation comprises a layer formed by two or more times of implantation, the ion implantation depths of which differ from each other.

5. The semiconductor device according to claim 4, wherein
the protruding semiconductor region comprises a protruding semiconductor island region, the protruding semiconductor island regions being aligned with predetermined intervals in a longitudinal direction thereof;

the gate electrode on the gate insulator film on the first side wall along the longitudinal direction of the protruding semiconductor island region crosses over the gate insulator film in perpendicular to the longitudinal direction of the protruding semiconductor island region in a central portion thereof such that the gate electrode is connected to a gate electrode on another side of the protruding semiconductor island region; and the semiconductor device further comprises a metal electrode in electrical contact with the base layer of the second conductivity type and the region of the first conductivity type exposed to a second side wall of the protruding semiconductor island region, the second side wall intersecting the longitudinal direction of the protruding semiconductor island region.

6. The method of manufacturing the semiconductor device comprising:

forming a semiconductor substrate of a first conductivity type comprising a first major surface;

forming at least one pair of trenches extending in parallel to each other and formed from the first major surface; each trench being from 0.5 um to 3.0 um in depth and 1.0 um or longer in short side width such that there is a protruding semiconductor region between the pair of trenches, the protruding semiconductor region being narrower than the trenches' and being from 0.5 um to 3.0 um in short side width with the trench being wider than the protruding semiconductor region in the short side width thereof;

forming a base layer of a second conductivity type in the protruding semiconductor region;

forming a region of the first conductivity type on a surface side of the base layer;

forming a gate insulator film on a first side wall of the protruding semiconductor region;

forming a gate electrode comprising electrically conductive polycrystalline silicon as a main component thereof on the gate insulator film; the gate electrode being from 0.2 um to 1.0 um in thickness the that there are protruding semiconductor regions.

7. The method of manufacturing the semiconductor device according to claim 6, the method further comprising the steps of:

depositing electrically conductive polycrystalline silicon on the protruding semiconductor region; and removing the polycrystalline silicon on the protruding semiconductor region from a surface thereof by dry-etching or by wet-etching to form a gate electrode.

8. The method of manufacturing the semiconductor device described in claim 6, wherein the base layer is grown epitaxially the method comprising the steps of: forming an oxide film on a first major surface of a semiconductor substrate by thermal oxidation or by CVD; patterning the oxide film; selectively growing an epitaxial semiconductor layer on an exposed surface of the semiconductor substrate using the oxide film for a mask and removing the oxide film to form a protruding semiconductor region.

9. The method of manufacturing the semiconductor device according to claim 8, wherein the step of selectively growing the epitaxial semiconductor layer using the oxide film for a mask to form the protruding semiconductor region comprises feeding an etching gas simultaneously with feeding a semiconductor gas for forming the epitaxial semiconductor layer.

10. The method of manufacturing the semiconductor device according to claim 9, the method further comprising the step of:

polishing a surface of the epitaxial semiconductor layer to remove an excessive semiconductor layer grown on the oxide film and to flatten the epitaxial semiconductor layer, the step of polishing being conducted after selectively growing the epitaxial semiconductor layer using the oxide film for a mask.

11. The method of manufacturing the semiconductor device described in claim 6, the method comprising the step of: forming a protruding semiconductor region in a voltage blocking structure region simultaneously with forming the protruding semiconductor region in an active region, the protruding semiconductor region in the voltage blocking structure region serving as a guard ring.

12. The method of manufacturing the semiconductor device according to claim 11, the method further comprising the step of:

polishing to remove polycrystalline silicon deposited on the protruding semiconductor region and serving as a guard ring in the voltage blocking structure region and to remove a part of the polycrystalline silicon deposited between the adjacent guard rings to shape a concave dish disconnected in the center thereof.

13. The method of manufacturing the semiconductor device described in claim 6, wherein the base layer is formed by ion implantation and the method comprises the step of: forming a protruding semiconductor region in a voltage blocking structure region simultaneously with forming the protruding semiconductor region in an active region, the protruding semiconductor region in the voltage blocking structure region serving as a guard ring.

14. The method of manufacturing the semiconductor device according to claim 13, the method further comprising the step of:

polishing to remove polycrystalline silicon deposited on the protruding semiconductor region and serving as a guard ring in the voltage blocking structure region and to remove a part of the polycrystalline silicon deposited between the adjacent guard rings to shape a concave dish disconnected in the center thereof.

15. The semiconductor device according to claim 1, wherein the region of the first conductivity type is lower than an upper end of the gate electrode.

16. The semiconductor device according to claim 1, wherein the gate electrode is formed within the trench.

17. The semiconductor device according to claim 15, wherein the gate electrode is formed within the trench.

* * * * *